(12) United States Patent
Gregerson et al.

(10) Patent No.: US 9,673,075 B2
(45) Date of Patent: Jun. 6, 2017

(54) WAFER CONTAINER WITH DOOR GUIDE AND SEAL

(75) Inventors: Barry Gregerson, Deephaven, MN (US); Matthew A. Fuller, Colorado Springs, CO (US); Michael S. Adams, Rochester, MN (US)

(73) Assignee: ENTEGRIS, INC., Billerica, MA (US)

( * ) Notice: Subject to any disclaimer, the term of this patent is extended or adjusted under 35 U.S.C. 154(b) by 432 days.

(21) Appl. No.: 13/880,948

(22) PCT Filed: Oct. 19, 2011

(86) PCT No.: PCT/US2011/056944
§ 371 (c)(1),
(2), (4) Date: Aug. 13, 2013

(87) PCT Pub. No.: WO2012/054644
PCT Pub. Date: Apr. 26, 2012

(65) Prior Publication Data
US 2013/0319907 A1 Dec. 5, 2013

Related U.S. Application Data

(60) Provisional application No. 61/394,776, filed on Oct. 20, 2010, provisional application No. 61/421,309, (Continued)

(51) Int. Cl.
*B65D 85/00* (2006.01)
*H01L 21/673* (2006.01)

(52) U.S. Cl.
CPC .. *H01L 21/67376* (2013.01); *H01L 21/67369* (2013.01); *H01L 21/67373* (2013.01)

(58) Field of Classification Search
CPC ......... H01L 21/67369; H01L 21/67373; H01L 21/67376; B65D 45/16; B65D 45/18; B65D 45/02; B65D 45/34
USPC ........ 206/710, 711, 454, 832, 722; 220/252, 220/796, 210, 241, 780, 784, 789, 812, 220/345.1, 324, 315
See application file for complete search history.

(56) References Cited

U.S. PATENT DOCUMENTS 4,995,430 A 2/1991 Bonora et al.
6,032,802 A * 3/2000 Ejima et al. .................. 206/711
(Continued)

FOREIGN PATENT DOCUMENTS

JP 2000058633 A 2/2000
JP 2005-320028 A 11/2005
(Continued)

*Primary Examiner* — Jacob K Ackun
*Assistant Examiner* — Rafael Ortiz

(57) ABSTRACT

A wafer container that reduces or alleviates one or more of the problems associated with excessive container wall deflection due to loading and excessive particulate generation, particularly as those problems are experienced with containers for 450 mm diameter and larger wafers. The container has an enclosure and door with interlocking features to enable transfer of tension load to the door to minimize deflection of container surfaces. The container may include a gasketing arrangement compatible with the interlock feature. The container may include a removable door guide that improves centering of the door during door installation, and that is made of low particle generating material to reduce particulates.

11 Claims, 21 Drawing Sheets

Related U.S. Application Data filed on Dec. 9, 2010, provisional application No. 61/523,218, filed on Aug. 12, 2011.

(56) References Cited

U.S. PATENT DOCUMENTS

| | | | |
|---|---|---|---|
| 6,105,782 A | 8/2000 | Fujimori et al. | |
| 6,206,196 B1 | 3/2001 | Krampotich et al. | |
| 6,464,081 B2 | 10/2002 | Nyseth et al. | |
| 7,017,750 B2 | 3/2006 | Matsutori et al. | |
| 7,029,013 B2 | 4/2006 | Yajima et al. | |
| 7,168,587 B2 | 1/2007 | Eggum | |
| 7,182,203 B2 | 2/2007 | Burns et al. | |
| 7,413,099 B2 * | 8/2008 | Takahashi | B65D 53/02 206/710 |
| 7,648,041 B2 | 1/2010 | Ueda et al. | |
| 8,118,169 B2 | 2/2012 | Hosoi et al. | |
| 8,356,713 B2 | 1/2013 | Ogawa | |
| 2002/0005369 A1 * | 1/2002 | Nyseth et al. | 206/711 |
| 2005/0274645 A1 * | 12/2005 | Hasegawa et al. | 206/710 |
| 2009/0206001 A1 | 8/2009 | Sasaki et al. | |

FOREIGN PATENT DOCUMENTS

| | | |
|---|---|---|
| JP | 2006-332261 A | 12/2006 |
| JP | 2007019328 A | 1/2007 |
| JP | 2007308161 A | 11/2007 |
| JP | 2010027861 A | 2/2010 |
| KR | 10-2004-0034181 A | 4/2004 |
| TW | 200806545 | 2/2008 |
| WO | 0247154 A1 | 6/2002 |

* cited by examiner

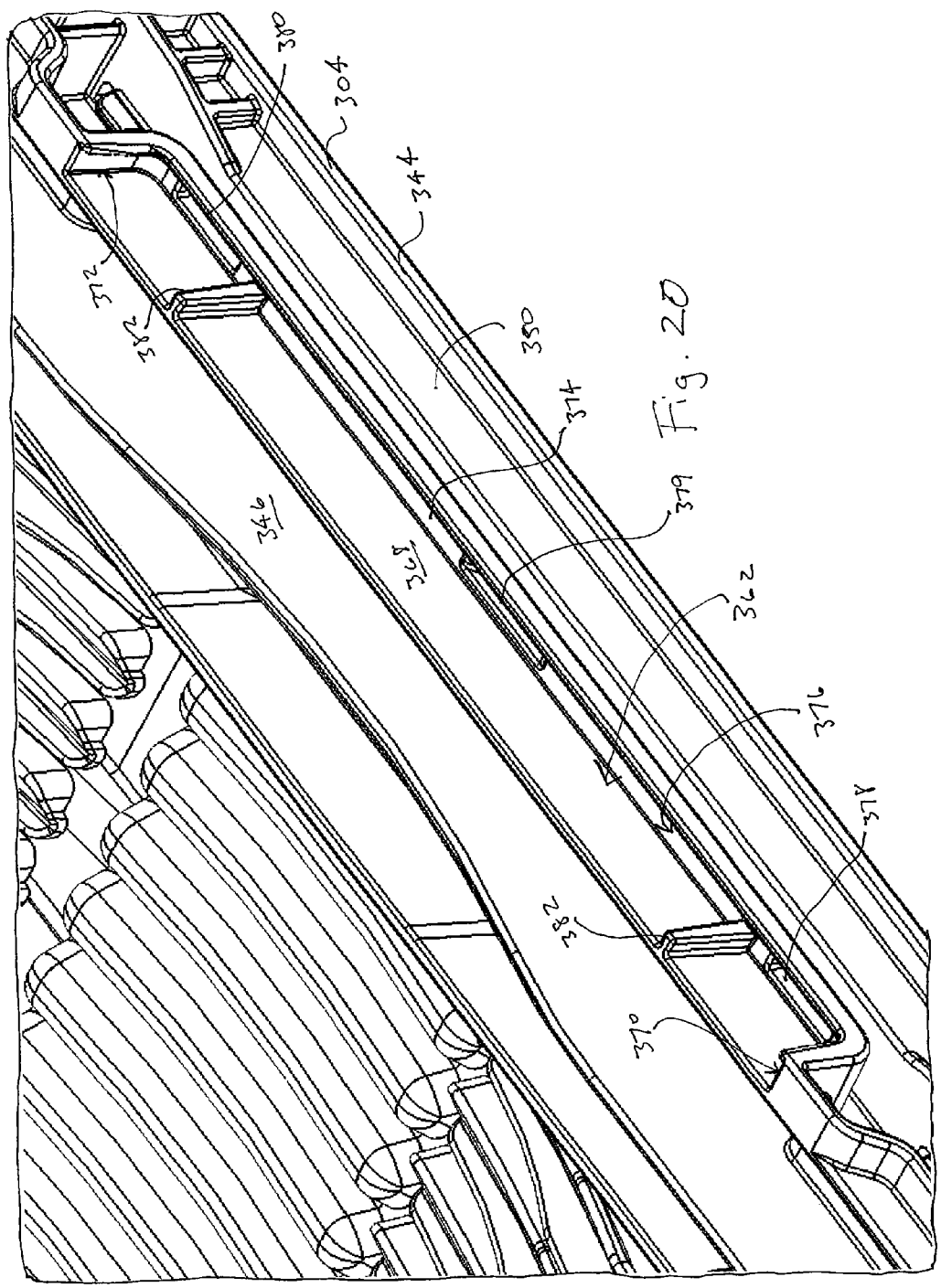

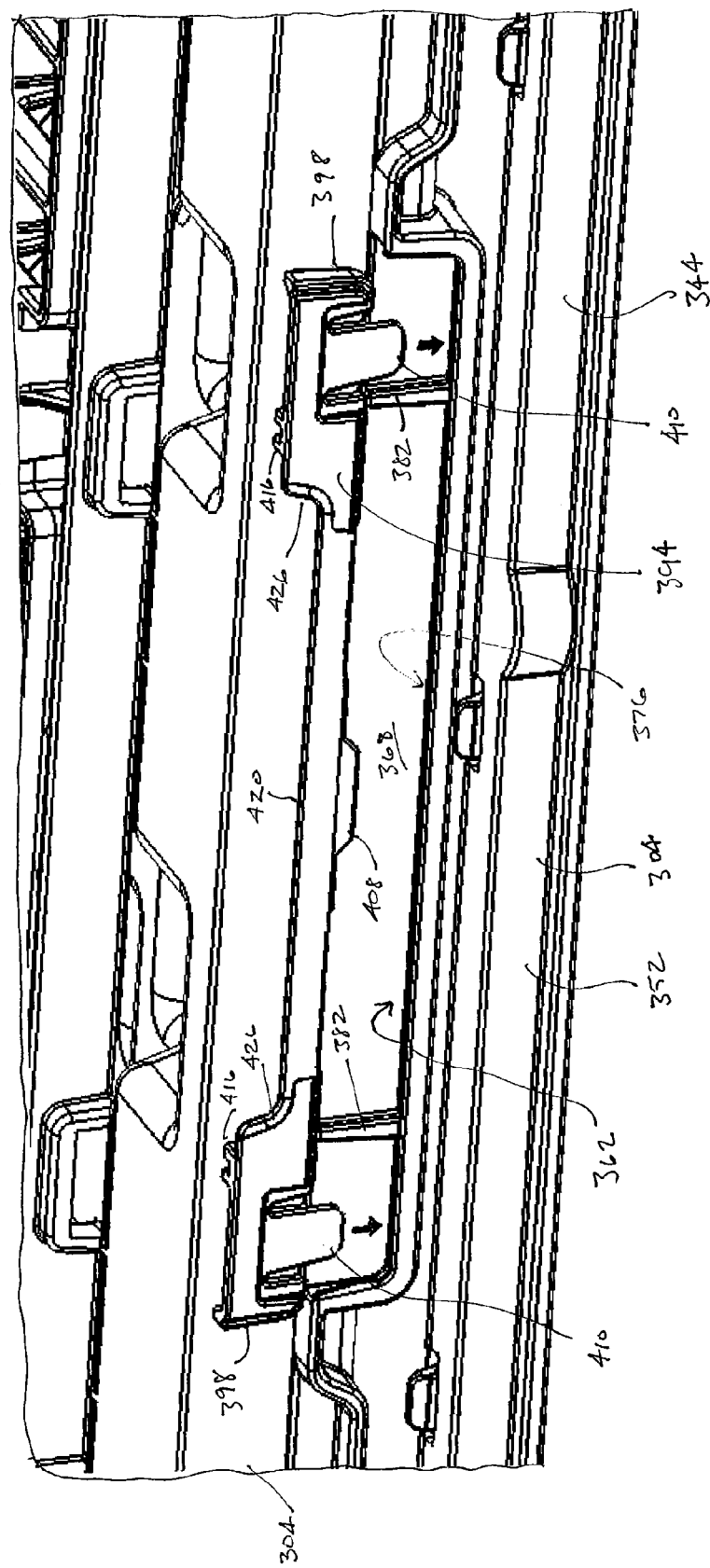

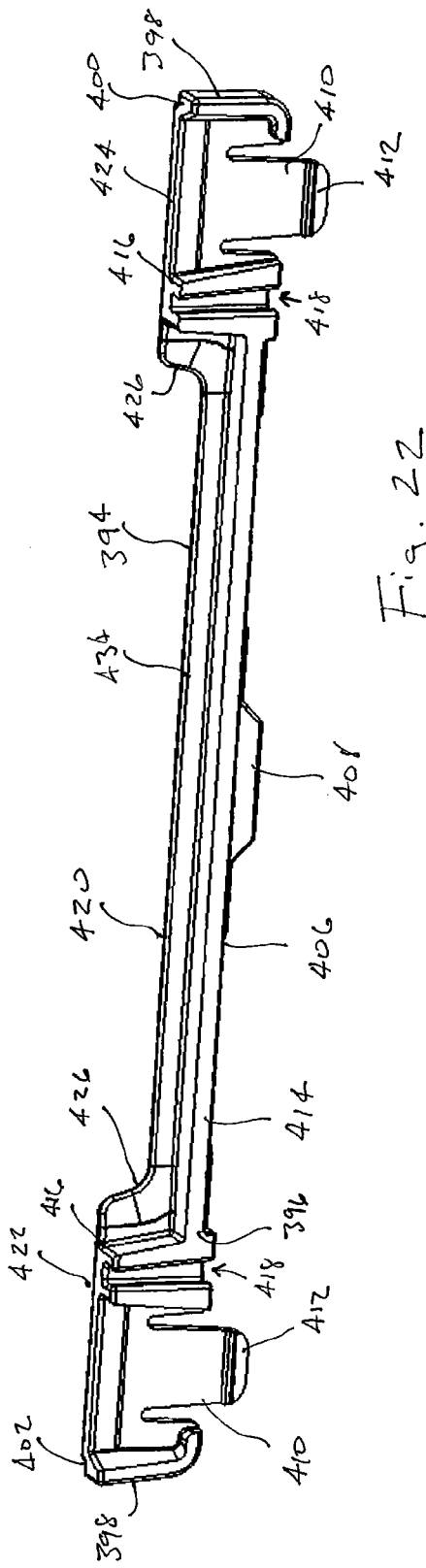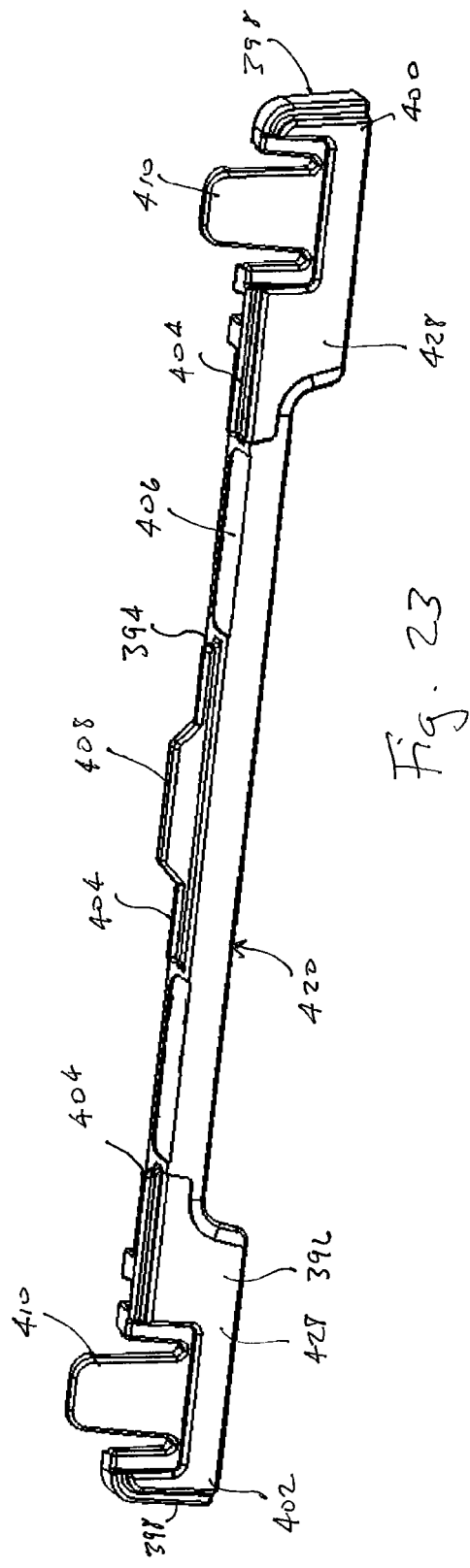

WAFER CONTAINER WITH DOOR GUIDE AND SEAL

RELATED APPLICATIONS

The present application is a National Phase entry of PCT Application No. PCT/US2011/056944, filed Oct. 19, 2011, which claims priority to U.S. Provisional Patent Application No. 61/394,776, filed Oct. 20, 2010, U.S. Provisional Patent Application No. 61/421,309, filed Dec. 9, 2010, and U.S. Provisional Patent Application No. 61/523,218, filed Aug. 12, 2011, the disclosures of which are hereby incorporated by reference herein in their entirety.

FIELD OF THE INVENTION

This invention relates to containers for sensitive substrates such as semiconductor wafers and in particular to the door and door frame interface of such containers.

BACKGROUND OF THE INVENTION

Integrated circuits such as computer chips are manufactured from semiconductor wafers. These wafers are subjected to numerous steps during the process of making integrated circuits. This generally entails transporting a plurality of wafers from one workstation to another for processing by specialized equipment. As part of the processing procedure, wafers may be temporarily stored or shipped in containers to other plants or to end users. Such intra-facility and extra-facility movements may generate or expose the wafers to potential wafer ruining contaminants. In order to reduce the deleterious effect of contaminants on wafers, specialized containers have been developed to minimize the generation of contaminants and to isolate wafers from contaminants exterior to the containers. A principal feature common to these containers is that they are provided with removable doors or closures to enable access to the wafers inside.

Plastic containers have been used for decades for transporting and storing wafers in-between process steps. Such containers have highly controlled tolerances for interfacing with processing equipment as well as the equipment/robots that transport the containers. Moreover, it is desirable in such plastic containers to use components that are attachable and removable without using metallic fasteners such as screws, since metal fasteners can cause particle generation when inserted and removed.

Additional, required or desirable characteristics of containers to transport and/or store semiconductor wafers include light weight, rigidity, cleanliness, limited gaseous emissions, and cost effective manufacturability. The containers provide hermetic or close to hermetic isolation of wafers when the containers are closed. Simply stated, such containers need to keep the wafers clean, uncontaminated, and undamaged. Additionally, carriers need to maintain their capabilities under the rigors of robotic handling which includes lifting the carrier by the robotic flange positioned at the top of the container.

Front opening wafer containers have become the industry standard for transporting and storing large diameter 300 mm wafers. In such, containers the front door is latchable within a door frame of a container portion, and closes a front access opening through which the wafers are robotically inserted and removed. When the container is fully loaded with wafers the door is inserted into the door frame of the container portion and latched thereto. When seated, cushions on the door provide upward, downward, and inward constraint for the wafers.

A seal, generally in the form of a continuous loop of elastomeric material is fastened on the periphery of the door to provide sealing. Typically such seals are attached by inserting a base portion into a groove on the periphery of the door and/or securing the seal on pegs extending through holes in the seal. Often the "loop" of seal material is smaller than the circumference of the groove. This has proved to provide good seal retention on the rounded corners but the tension in the seal does little to retain the seal in the grooves in the large straight expanses of the top, bottom, and sides of the door. Uniformity and consistency of the sealing has been encountered particularly as the openings in wafer containers have increased to accommodate larger wafers.

The semiconductor industry is now moving toward using even larger, 450 mm diameter, wafers. The larger diameter wafers, although providing cost efficiencies, also provide increased fragility, greater weight, and present undiscovered issues associated with handling and storing the larger wafers in containers made of plastic. Deflection and related problems associated with the expanses of plastic on the top, bottom, sides, front, and back are exacerbated, as are door sealing issues due to uneven seals and distortion of the door to door-frame interface due to the deflection of container surfaces.

Along with increasing size of semiconductor wafers, the density of the circuits formed on the wafers has also been increasing, making the circuits more susceptible to defects from smaller and smaller particles and other contaminants. In short, as wafers have increased in size, containers have increased in size as well, and the requirements for keeping the wafers clean and contaminant free have become more stringent due to the wafers being more susceptible to smaller particles and other contaminants.

There are several drawbacks associated with prior wafer handling devices or containers related to particulate generation. During the working life of a container, the closure or door is attached and removed many times by both robotic and manual means. With each attachment and removal, a portion of the door edge may scrape against the door frame of the container. This can result in the generation of loose particles which may become airborne to lodge on the wafers being contained. Equally important, doors of wafer handling devices or containers typically include cushions or channels which contact and support wafer edges. Optimally, such cushions or channels are designed to operate in concert with wafer receiving channels in the containers to securely retain a plurality of wafers. If a door is not, and cannot be accurately and repeatedly centered within a door frame, excessive contact and subsequent particle generation between the door cushions or channels and wafers may occur.

The problem of particle generation may also be attributed to the process by which doors and containers are manufactured. Containers and doors are usually formed by injection molding with plastic such as polycarbonate. Inherent in such molding is shrinkage and warpage of the molded parts. Although plastic injection molding techniques are highly advanced, there still may be individual deviations between different components form the same mold. While slight deviations do not generally compromise the function of a door in closing an container, they can change the working dimensions to the extent that contact (and the resultant particle generation) between a door and a door frame is increased. Dimensional changes can also be generated by the dies themselves, as a result of normal wear and tear. This problem is accentuated when the tolerances of the components of doors and containers are stacked or added.

Yet another drawback occurs because these wafer carriers are robotically opened and closed. The carriers will be opened by multiple pieces of equipment which may each be set up differently. Also such equipment may go out of adjustment and is subject to wear and tear. Such equipment may not then be perfectly aligned resulting in undesirable and/or excessive door-frame contact and a situation of excessive abrasion and/or particle generation.

Accordingly, a need in the industry exists for a wafer container that addresses one or more of these problems, particularly as they exist relative to containers for 450 mm diameter and larger wafers.

SUMMARY OF THE INVENTION

Embodiments of the invention address the need of the industry for a wafer container that reduces or alleviates one or more of the problems associated with excessive container wall deflection due to loading and excessive particulate generation, particularly as those problems are experienced with containers for 450 mm diameter and larger wafers.

In an embodiment, a front opening wafer container suitable for large diameter wafers uses an elastomeric gasket configured and shaped as a rectangular frame with rounded corners. The elastomeric material may be sandwiched between a gasket retention frame and a door housing member. In an embodiment of the invention, the gasket retention frame covers a substantial portion of the inside face of the door. In an embodiment of the invention, the gasket retention frame has a door guide member that extends around the periphery of the door and cooperates with a similar structure on the door frame to provide a guiding action if the door is not perfectly aligned when it is inserted into the door frame, and thereby inhibiting particulate generation by frictional contact between components. The door guide member and cooperating door frame portion may each have tapered surfaces that cooperate and engage each other.

In an embodiment of the invention the gasket material is configured as sheet material having a relatively uniform thickness. An exposed tip of the seal extends outwardly to engage a side wall of the door frame of the enclosure portion. In other embodiments, the gasket is not of relatively uniform thickness with the gasket material molded. In an embodiment of the invention, the gasket retention framework can be integrally formed with wafer cushions. In another embodiment, the gasket material is overmolded on the gasket retention frame.

In an embodiment, the inside surface of the front door intermediate the wafer cushions and the seal is provided by a single unitary frame that overlies the gasket layer, with the peripheral edge of the gasket material protruding radially outward from the door for engaging the inwardly facing surface of the door frame.

In an embodiment of the invention, in a door for a front opening wafer container, the periphery of the door has three distinct layers exposed at the periphery: a door base portion, an elastomeric seal, and a gasket frame.

In an embodiment of the invention, the sealing member provides an interlocking portion that is inserted into a circumferential groove extending around the door opening. The sealing member has a body portion with a retained portion secured to the door and an outwardly extending portion extending from the retained portion. The outwardly extending portion may be L-shaped and include a radially extending portion and an axially extending portion with the axially extending portion defining the interlocking portion. The sealing member may be endless, that is, loop shaped. The sealing member can have door frame elongation resistance features that can secure the door frame, particularly the midportion top and midportion bottom of the door frame, such that the door in association with the sealing member inhibits vertical elongation of the door frame when the container is supported by the top of the container portion, for example by a robotic flange attached thereto and particularly when the container is loaded with wafers. Specific aspects of embodiments may include the sealing member being under circumferential tension which may increase the effective durometer of the sealing member and enhance the resistance of the radially extending portion to resist radial expansion of the outwardly extending portion. Such radial expansion may occur by the axially extending portion rotating upwardly and in a direction away from the container portion. A rigid stop may be positioned opposite the container portion side of the extending portion to preclude or reduce said rotation. A angled strip of material of a non elastomeric quality or of a lesser elastomeric characteristic that the body portion of the elastomeric seal, can be utilized to further assist the axially extending portion in resisting the rotation upward and away from the container portion caused by elongation stresses in the door frame.

In an embodiment, the gasket retention framework also forms a peripheral door guide and frame shape retainer with a projection projecting in the "z" direction and extending around the periphery of the door with a taper on the inside surface of the projection. The peripheral door guide is configured to engage a corresponding generally v-shaped recess with a matching tapered surface on the door frame.

In an embodiment, a semiconductor wafer carrier has an enclosure with a door frame defining an opening for insertion and removal of wafers, a door for closing and sealing said opening, and separately formed door guides for controlling the interface between said door and the enclosure. In some embodiments, the door guides each comprise elongate members that extend along the perimeter of the door, and are centrally positioned on one, two or four perimeter side surfaces of the doors. Each provide locating, that is positioning functions in both the "x" and "y" directions (the "z" direction being the insertion and removal direction of the door into and out of the door frame).

In an embodiment, the door guides have a peripherally extending elongate and thin rib that fits into a slot in the door frame. Each door guide may have a U-shaped opening with the legs of the U slanted to provide a guide in positioning the edge, with the U facing inward in the "z" direction towards the enclosure and enclosure door frame before and when the door is inserted into the door frame. The rib fitting into the slot may be seated, that is, in contact and engagement with the door frame or may be separated and not in direct contact with the door frame. In a preferred embodiment, the door has a vertical and a horizontal centerline and a door guide is positioned on the top peripheral side centered about the door centerline. A door guide may similarly be positioned on the lateral peripheral sides and the bottom peripheral side, each centered about the respective door centerline. Each door guide may have two positioning portions with each providing guide surfaces for positioning the door in the x and y directions.

In an embodiment, each door guide may have a detent, for example a tongue shaped detent, that engages a slot in the door frame. Each door guide may have two detents. Further, each door guide may have receivers for engaging projections on the door frame or vice versa. The projections and receivers can be wedge shaped to provide a definitive and guided-in locking position. Thus, in embodiments the guide extends along the peripheral edge of the door and is attached without separate fasteners.

In an embodiment, the guides are formed from a mixture including polybutylene terephthalate (PBT) or Acetal. These materials seem to have a favorable low particle generating characteristics in this context, that is minimizing particle generation during door-edge to door-frame engagement.

In alternative embodiments, the guides may be attached to the door frames in addition to or rather than the doors. Where the guides are attached to both the door and door frame, the guides may be attached in an offset or face to face cooperating relation.

The guides may be utilized with or without corner guides such as disclosed in U.S. Pat. Nos. 6,206,196 and 6,464,081, both fully incorporated herein by reference.

According to an embodiment, a front opening container for semiconductor wafers includes an enclosure portion including a top wall, a bottom wall, a pair of side walls, a back wall, and a door frame opposite the back wall, the door frame defining a front opening, the door frame having a plurality of intersecting side walls forming a plurality of door frame corners, each side wall defining a ramped portion intermediate adjacent door frame corners, and a door removably received in the door frame for closing the front opening, the door comprising a body portion presenting a plurality of intersecting peripheral faces. The container further includes a plurality of door guides, each door guide disposed on a separate one of the peripheral faces such that each door guide is engaged with a separate one of the ramped portions of the door frame when the door is received in the door frame.

According to an embodiment, the door frame may define an outwardly facing recess inward from each ramped portion and extending parallel with a front edge of the front opening. Each door guide may define an edge, the edge of the door guide being engaged in the recess to interlock the door with the enclosure portion when the door is received in the door frame. The recess may be generally v-shaped and present an engagement surface, and the edge of the door guide may have an engagement surface conformingly disposed so as to confront the engagement surface of the recess when the edge of the door guide is received in the recess.

In an embodiment, each of the plurality of peripheral faces of the body portion defines a door guide recess, and a separate one of the door guides is received in each of the door guide recesses. Each of the door guides may have at least one engagement structure, the at least one engagement structure received by a corresponding engagement structure in the door guide recess. The at least one engagement structure can be an engagement tab, and the corresponding engagement structure can be an aperture.

In an embodiment, the door of the container may include an elastomeric seal extending around a periphery of the door, the elastomeric seal engaging structure on the door frame when the door is received in the door frame to hermetically seal the enclosure portion. The container may also include a wafer cushion disposed on a rear side of the door. The door guide can be made from a low particle generating material, which can be acetal or PBT.

In another embodiment, a front opening container for semiconductor wafers includes an enclosure portion including a top wall, a bottom wall, a pair of side walls, a back wall, and a door frame opposite the back wall. The door frame defines a front opening and a forwardly facing recess extending around an inner periphery of the door frame parallel with a front edge of the door frame. A door is removably received in the door frame for closing the front opening. The door includes a body portion presenting a rear side and a gasket assembly disposed on the rear side. The gasket assembly includes a gasket frame and a gasket. The gasket frame defines an elongate projection extending around a periphery of the door, the gasket being retained between the gasket frame and the body portion. The gasket includes a laterally projecting sealing portion. The projection of the gasket frame is received in the recess of the door frame to interlock the door with the door frame when the door is received in the door frame, and the laterally projecting portion of the gasket engages and seals against a side wall of the door frame when the door is received in the door frame. In an embodiment, the gasket assembly includes an integrally formed wafer cushion. In some embodiments, the gasket assembly substantially covers the entire rear side of the body portion of the door. In a further embodiment, the gasket can be over-molded on the gasket frame.

In an embodiment, the forwardly facing recess is generally v-shaped and presents an engagement surface, and the projection of the gasket assembly has an engagement surface conformingly disposed so as to confront the engagement surface of the recess when the projection is received in the recess.

In a further embodiment, a front opening container for semiconductor wafers includes an enclosure portion including a top wall, a bottom wall, a pair of side walls, a back wall, and a rectangular door frame opposite the back wall, the door frame defining a front opening, the door frame defined by side walls extending between corners of the rectangular door frame, each side wall defining a ramped portion intermediate adjacent corners. A rectangular door is removably received in the door frame for closing the front opening, the door comprising a body portion presenting four intersecting peripheral faces. The container further includes a plurality of door guides, each door guide disposed on a separate one of the peripheral faces such that each door guide is engaged with a separate one of the ramped portions of the door frame when the door is received in the door frame.

In an embodiment, the door frame defines an outwardly facing recess inward from each ramped portion and extending parallel with a front edge of the front opening. Each door guide defines an engagement structure, the engagement structure of the door guide being engaged in the recess to interlock the door with the enclosure portion when the door is received in the door frame. In some embodiments, the recess is generally v-shaped and presents an engagement surface, and the engagement structure of the door guide has an engagement surface conformingly disposed so as to confront the engagement surface of the recess when the engagement structure of the door guide is received in the recess. In some further embodiments, each of the plurality of peripheral faces of the body portion defines a door guide recess, and a separate one of the door guides is received in each of the door guide recesses. Each of the door guides may have at least one engagement structure, the at least one engagement structure received by a corresponding engagement structure in the door guide recess.

An advantage and feature of the invention is that a shock absorption characteristic is provided by having the door frame engaging portion of the door having a gasket layer between it and the door base. This reduces the transfer of shock waves, such as from the operation of the latch mechanisms, into the container portion, such shock waves, can then launch particles from the inside surfaces of the container portion.

An advantage and feature of the invention is that a the gasket engages with a sealing surface substantially extending in the z-x plane or the z-y plane. The gasket lip extending from the door periphery extends outward to engage substantially normally with sealing surface. The effect of slight distortions in the door frame on affecting the sealing integrity is minimized.

An advantage and feature of embodiments of the invention is a circumferential seal comprising an elastomeric body member and a rigidizing strip member extending therearound and adhered thereto. The rigidizing strip member is of a different durometer hardness.

An advantage and feature of embodiments of the invention is a circumferential seal in a loop shape and comprising an elastomeric body member and a strip member extending around the length of the loop. The strip member may provide an engagement surface.

An advantage and feature of embodiments of the present invention to provide the door of a wafer container with removable door guides centered on a peripheral face of the door.

An advantage and feature of embodiments of the present invention is to reduce the amount of particulates generated by frictional contact between a door and a door frame.

An advantage and feature of embodiments of the present invention is to facilitate centering of a door within a door frame.

An advantage and feature of embodiments of the present invention is to reduce the amount of particulates generated by frictional contact between door mounted cushions and semiconductor wafer edges.

An advantage and feature of embodiments of the present invention is to increase permissible tolerances between a door and a door frame.

An advantage and feature of embodiments of the present invention is that guides may be removably attached at various locations on a door.

An advantage and feature of embodiments of the invention is that the guides are fabricated out of a relatively hard and low friction material which resists wear.

An advantage and feature of embodiments of the invention is to reduce deflection of the top, bottom, sides, and/or front of a container enclosure by interlocking the door of the container with the enclosure portion.

An advantage and feature of embodiments of the invention is to reduce the velocity of air entering the container when the door is removed from the enclosure portion, thereby inhibiting the spread of particulates to the inside of the enclosure.

BRIEF DESCRIPTION OF THE DRAWINGS

The embodiments of the present invention may be more completely understood in consideration of the following detailed description of various embodiments in connection with the accompanying drawings, in which:

FIG. 4A is a fragmentary cross-sectional view of the container of FIG. 4 with door slightly separated from the door frame of the enclosure position;

FIG. 20 is an isometric view of the rear side of the door of FIG. 16, with the door guides omitted to show the door guide engaging apertures;

FIG. 21 is a partial isometric view of the side of the door of FIG. 16, depicting the door guide in a position registered for insertion in the receiving recess;

FIG. 22 is an isometric view of the inner side of a door guide of the door assembly of FIG. 16; and FIG. 23 is an isometric view of the outer side of the door guide of FIG. 22.

Figure 1:
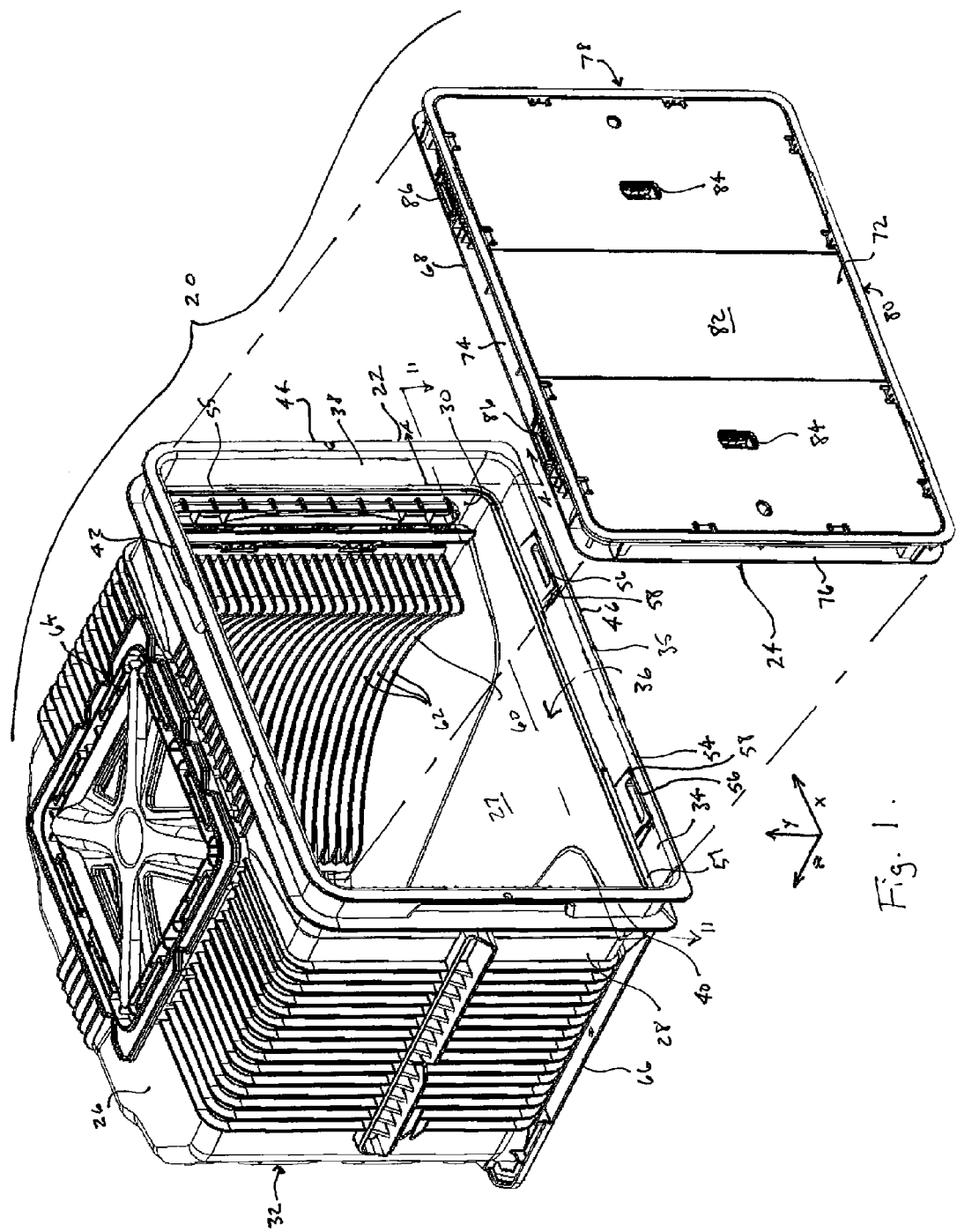
FIG. 1 is an exploded front isometric view of a front-opening wafer container according to an embodiment of the invention.

While the present invention is amenable to various modifications and alternative forms, specifics thereof have been shown by way of example in the drawings and will be described in detail. It should be understood, however, that the intention is not to limit the present invention to the particular embodiments described. On the contrary, the intention is to cover all modifications, equivalents, and alternatives falling within the spirit and scope of the present invention.

DETAILED DESCRIPTION

Figure 13:
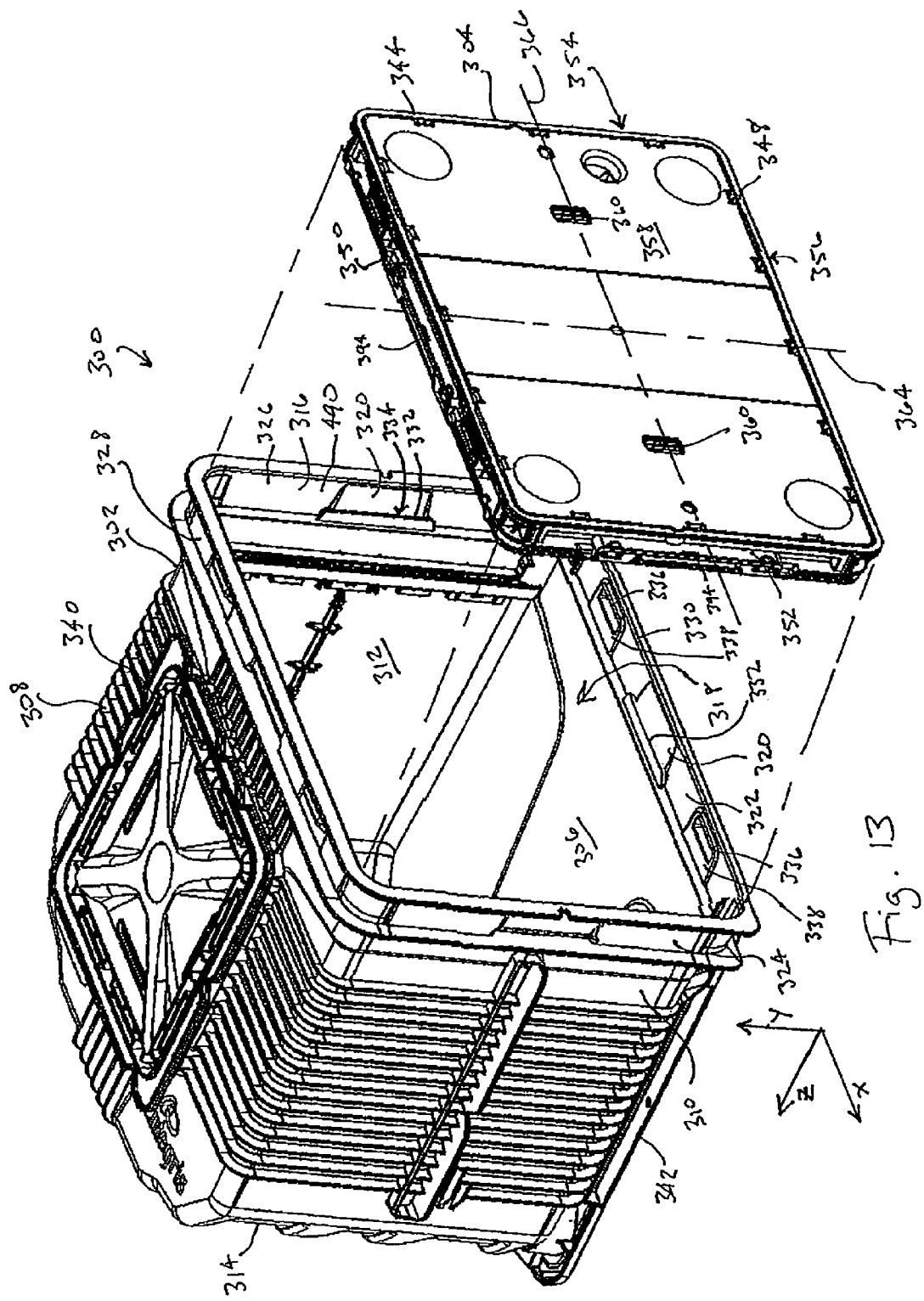
FIG. 13 is an exploded front isometric view of a front-opening wafer container according to another embodiment of the invention.
Figure 14:
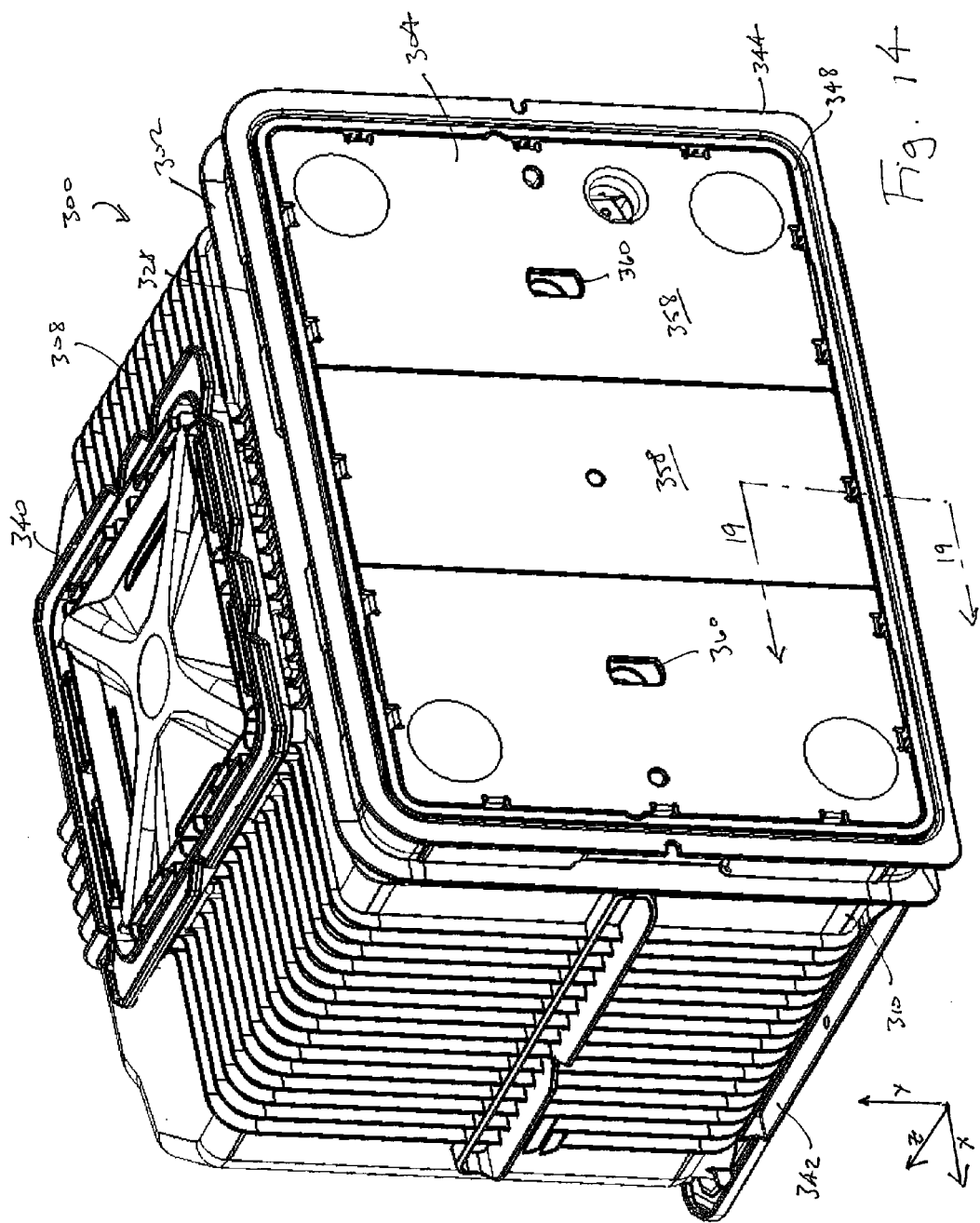
FIG. 14 is an assembled front isometric view of the front-opening wafer container of FIG. 13.
Figure 15:
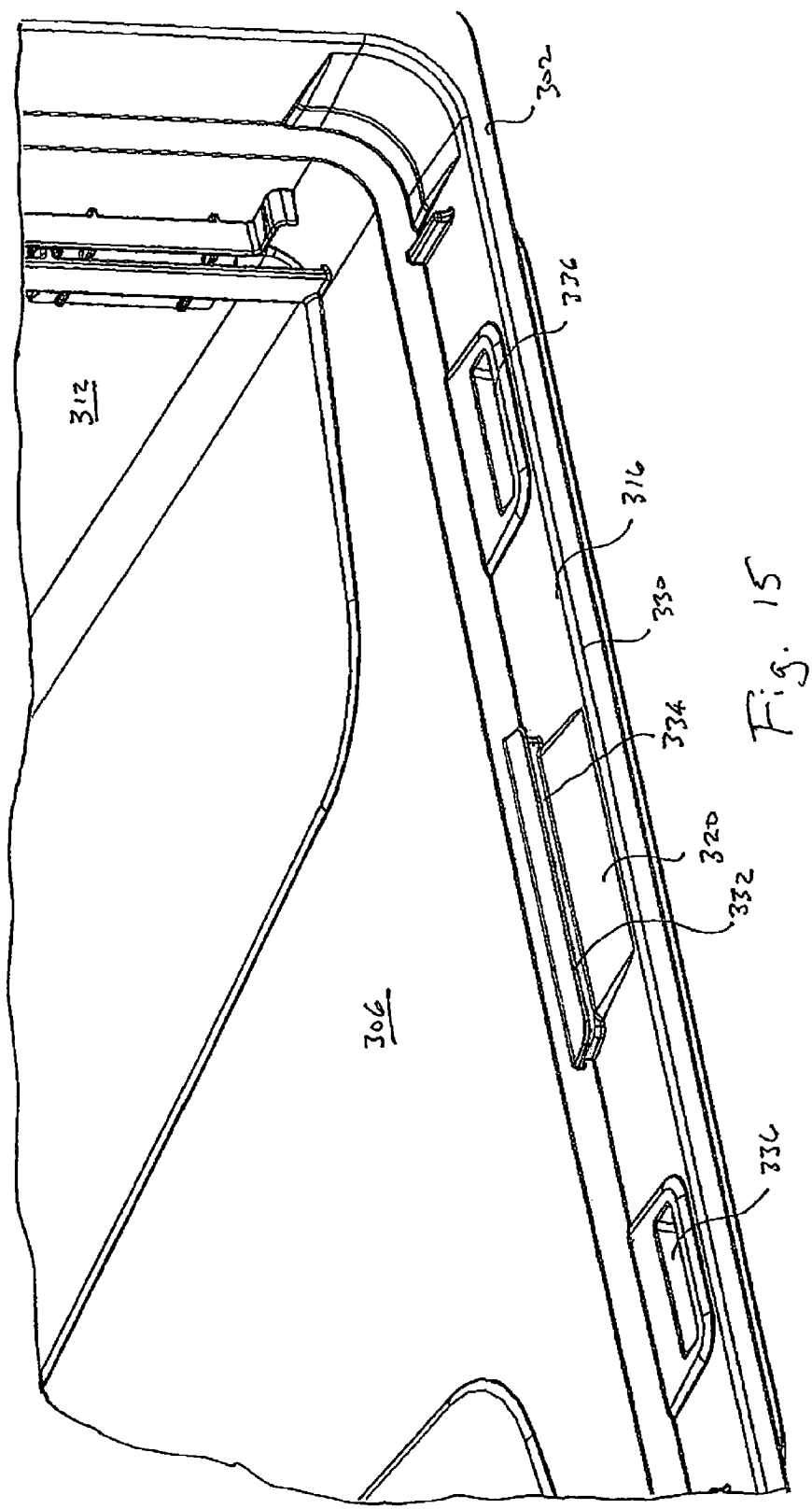
FIG. 15 is an isometric view of the bottom edge of the door frame of the container of FIG. 13, depicting the ramped door guide engagement portions and interlocking feature.
Figure 16:
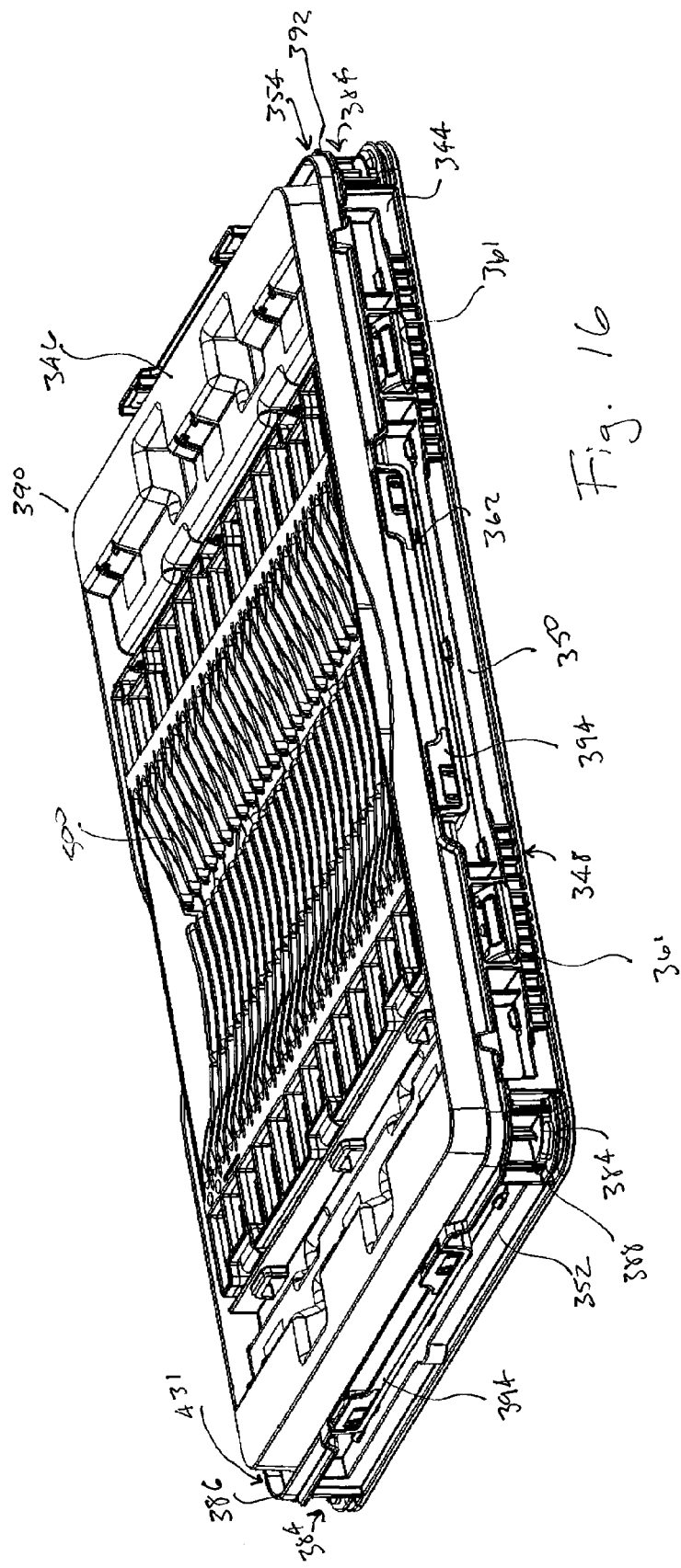
FIG. 16 is an isometric view of the rear side of the door assembly of the wafer container of FIG. 13.
Figure 17:
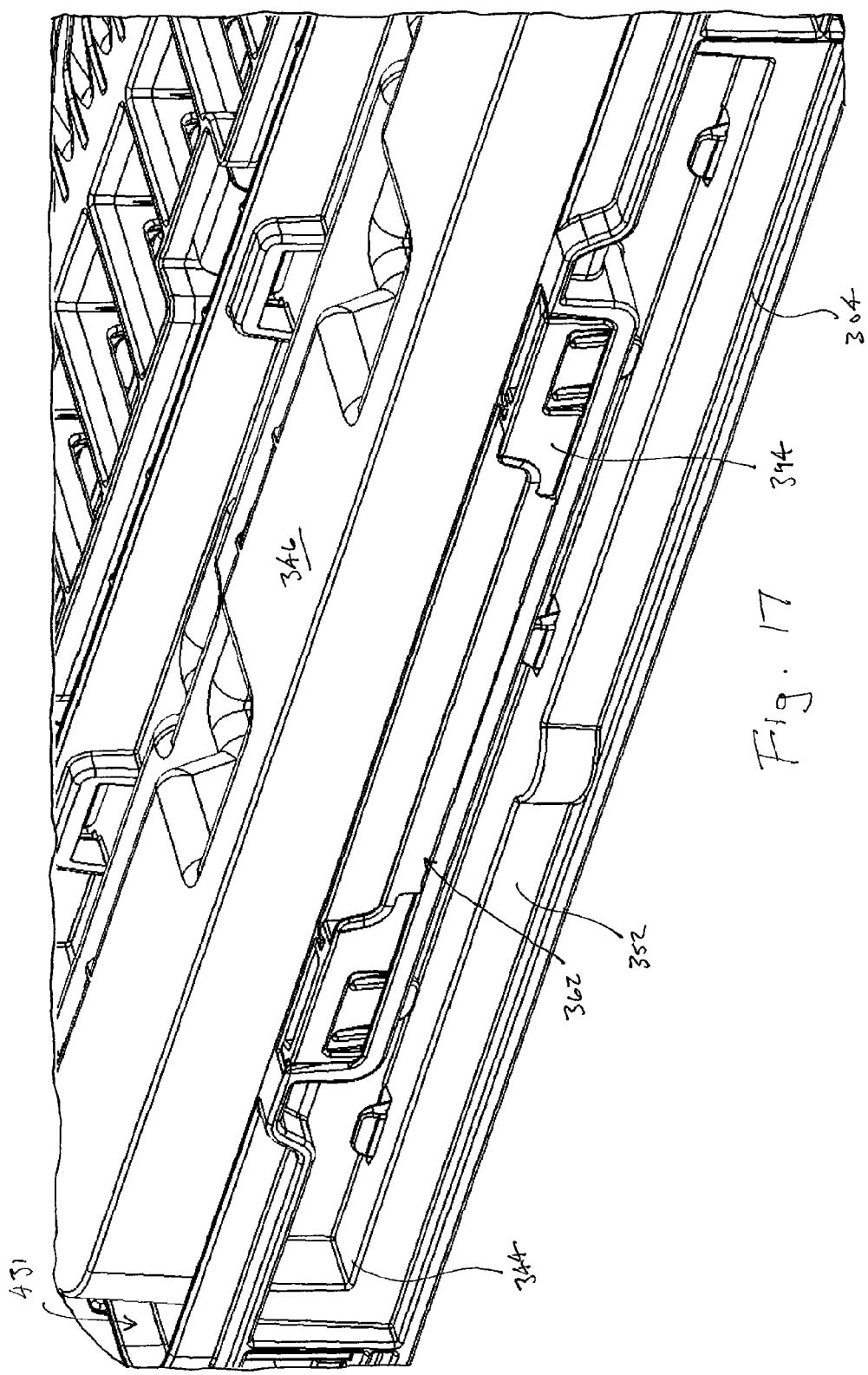
FIG. 17 is a detail view of one of the side door guides of the door assembly of FIG. 16.
Figure 18:
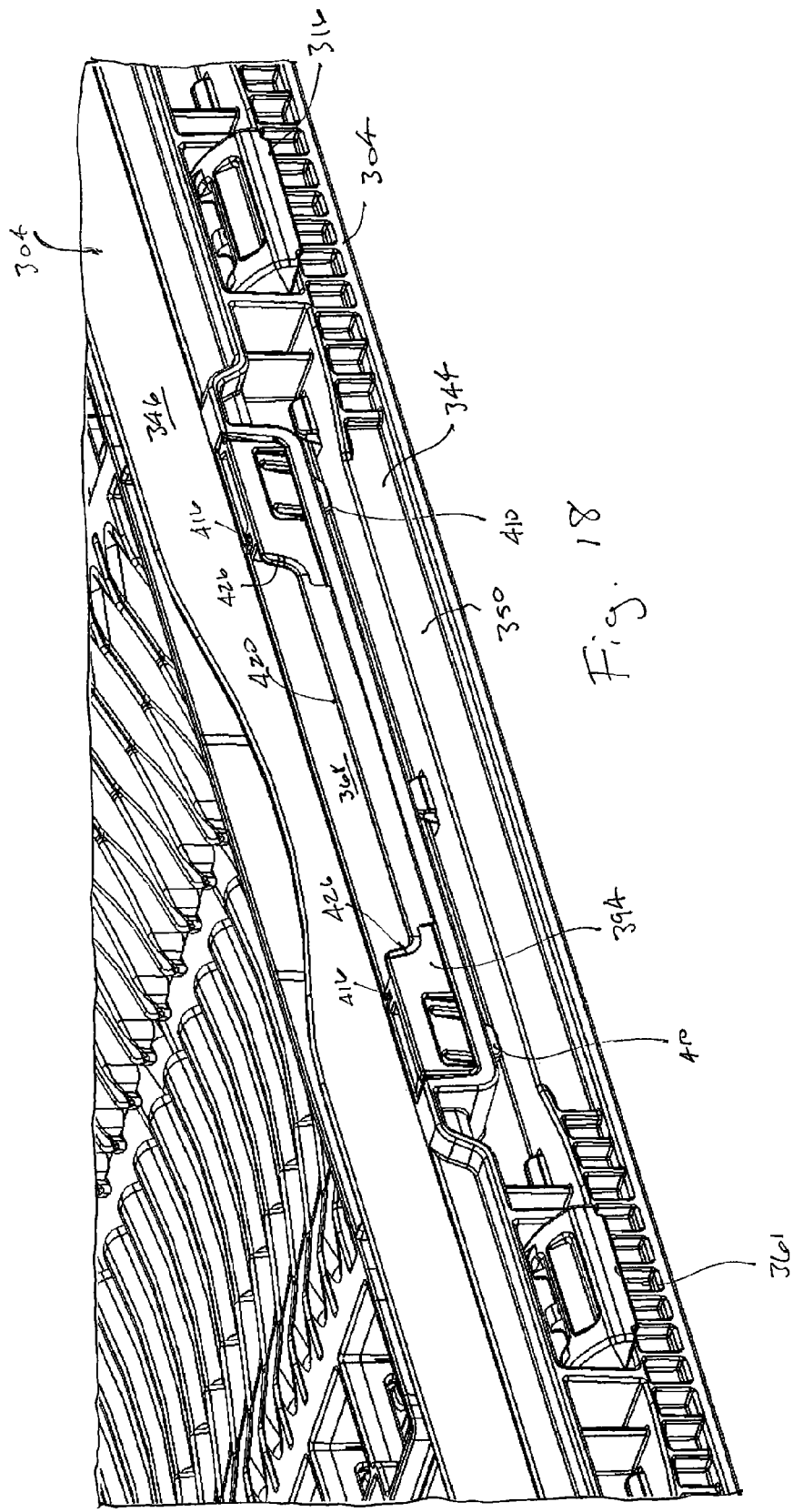
FIG. 18 is a detail view of the top door guide of the door of FIG. 16.

For purposes of this application, relative direction may be described in terms of "x" and "y" and "z" directions, and these designations relative to the parts of the container are intended to be in accordance with the directional key provided as a part of FIGS. 1, 13 and 14.

Referring now to FIG. 1, a front opening wafer container 20 generally includes an enclosure portion 22 and a front door 24. Enclosure portion 22 generally includes top wall 26, bottom wall 27, side walls 28, 30, back wall 32, and door frame 34 defining a front opening 36. In addition, latch bolt recesses 56 are defined in each of top side 42 and bottom side 46 of door frame 34. Each latch bolt recess 56 is surrounded by raised portion 58. Outwardly facing interlock groove 55 is defined at inner edge 57 of door frame 34. Wafer support structure 60 may be provided inside enclosure portion 22 for receiving wafers in a plurality of slots 62. A robotic lifting flange 64 and a kinematic coupling 66 as are known in the art may be provided on the top and bottom outer surfaces respectively of enclosure portion 22.

Front door 24 generally includes body portion 68 presenting rear side 70, front side 72, top peripheral face 74, side peripheral faces 76, 78, and bottom peripheral face 80. A pair of latch recesses (not depicted) are defined in front side 72, and are covered by front panel 82. Each latch recess receives a latching mechanism (not depicted), operable by a key insertable though key apertures 84 in front panel 82 to selectively extend and retract latch bolts 86 to engage in latch bolt recesses 56 of container portion 22 to secure front door 24 in door frame 34. The latch mechanisms can be generally configured as disclosed in U.S. Pat. No. 4,995,430; 7,182,203; or 7,168,587, all of which are owned by the owner of the instant application, and all of which are hereby incorporated herein by reference.

Figure 2:
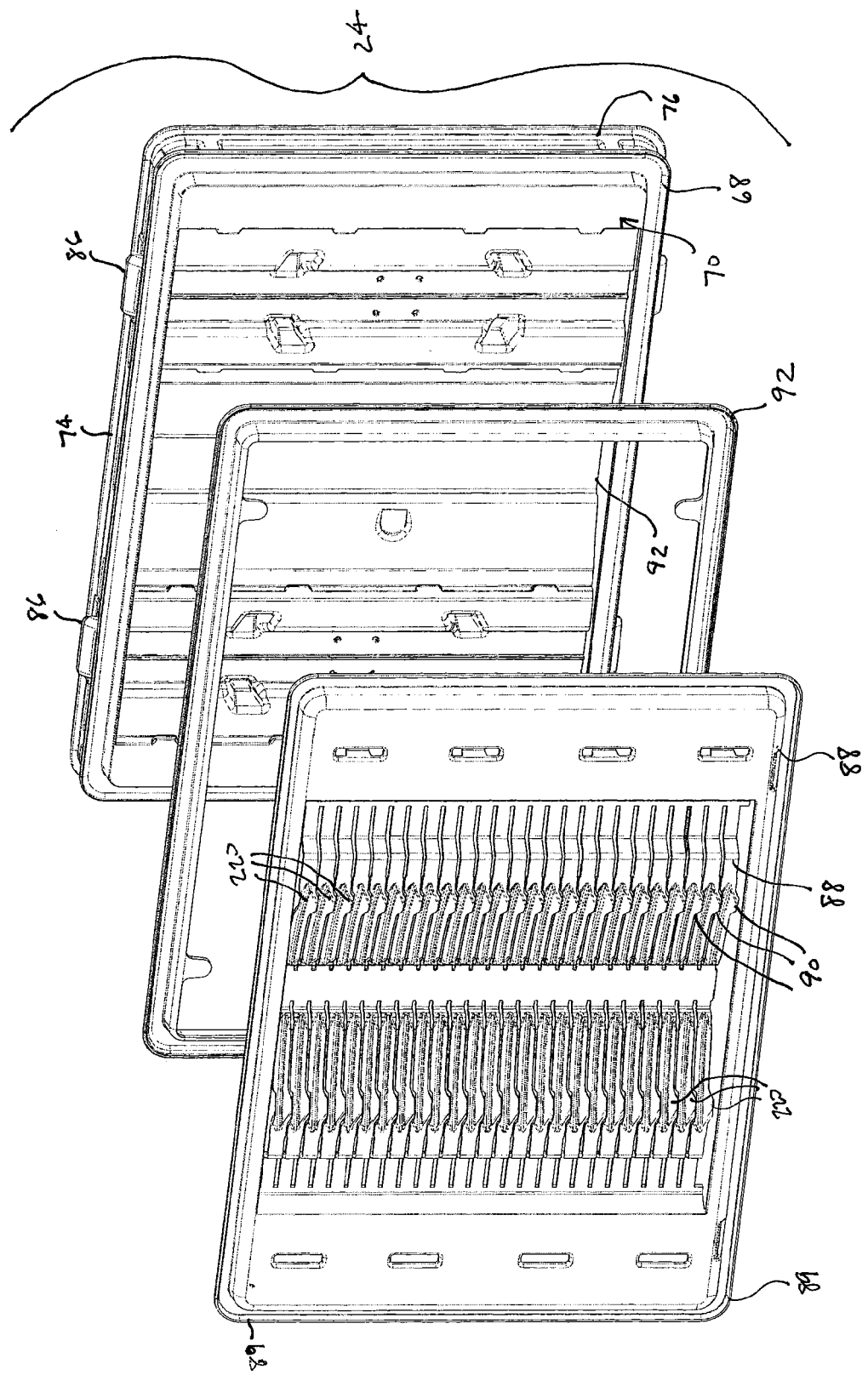
FIG. 2 is an exploded isometric view of an embodiment of a front door assembly for the container of FIG. 1.

In an embodiment depicted in FIG. 2, front door 24 includes wafer cushion member 87 having wafer cushion 88 with a plurality of wafer engaging portions 90. Wafer cushion member 87 is positioned on rear side 70 of body portion 68 with gasket member 92 interposed between the two. Notably, wafer cushion member 87 covers substantially the entirety of rear side 70 in the depicted embodiment. Wafer cushion 88 is received in recess 92 formed in body portion 68, with recess 92 extending from the top of the door to the bottom of the door and is centrally positioned with respect to the left and right sides of the door. The recess has different depths, with the deepest portion extending along the vertical mid-line of recess 92. Wafer cushion member 87 defines forwardly projecting lip 89 around its entire periphery.

Figure 3:
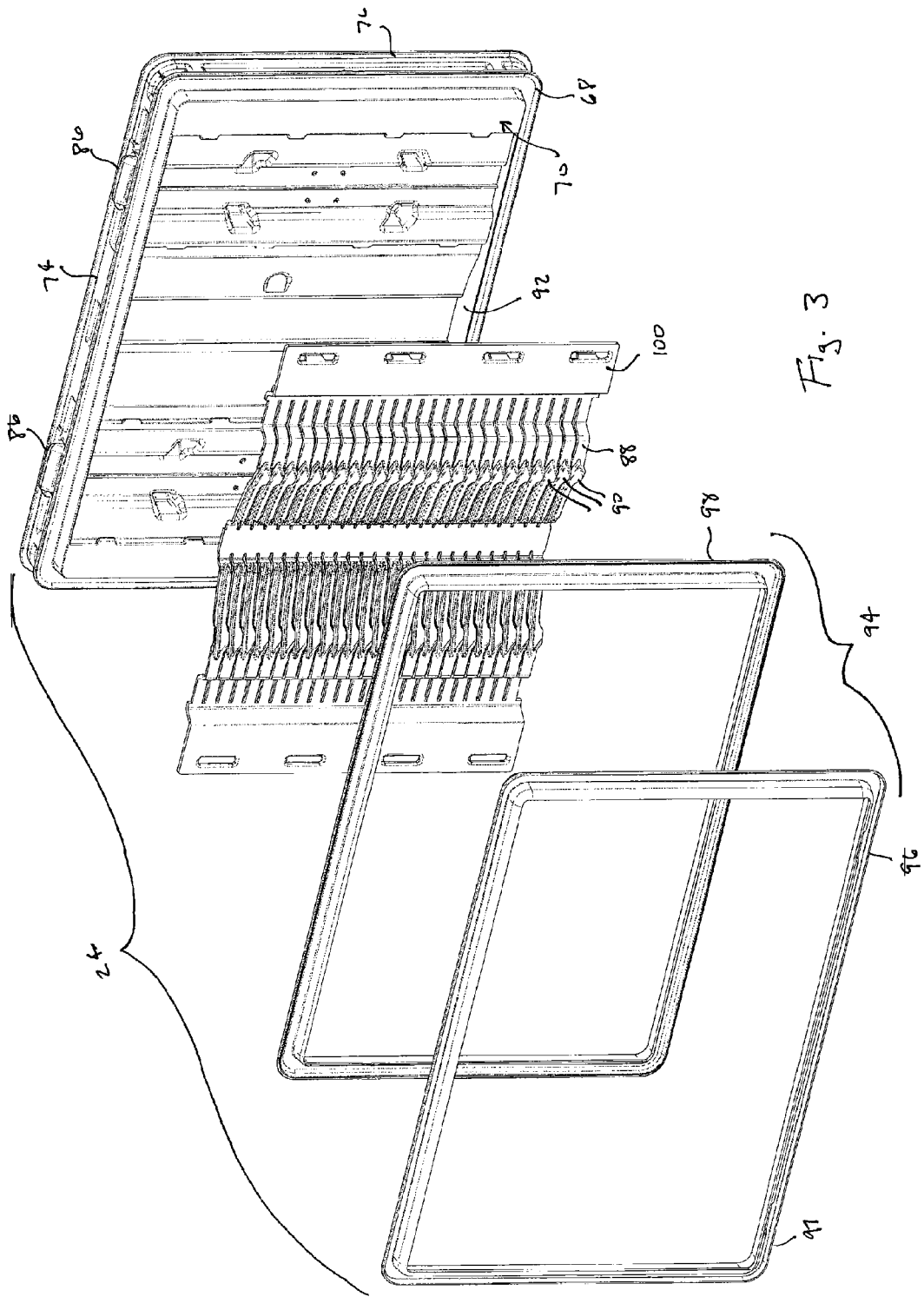
FIG. 3 is an exploded isometric view of another embodiment of a front door assembly for the container of FIG. 1.

Referring to FIG. 3, an alternative embodiment of front door 24 is depicted. Gasket frame assembly 94 generally includes gasket frame 96, and gasket 98. Gasket 98 can be either separately formed from gasket frame 96 as depicted, or over-molded on gasket frame 96 using commonly known over-molding techniques. Gasket frame 96 defines forwardly projecting lip 97 around its entire periphery. Wafer cushion member 100 is separate from gasket frame assembly 94 and includes wafer cushion 88 with a plurality of wafer engaging portions 90. Wafer cushion member 100 is sandwiched between gasket frame assembly 94 and body portion 68. Again, wafer cushion 88 is received in recess 92 formed in body portion 68.

Figure 4:
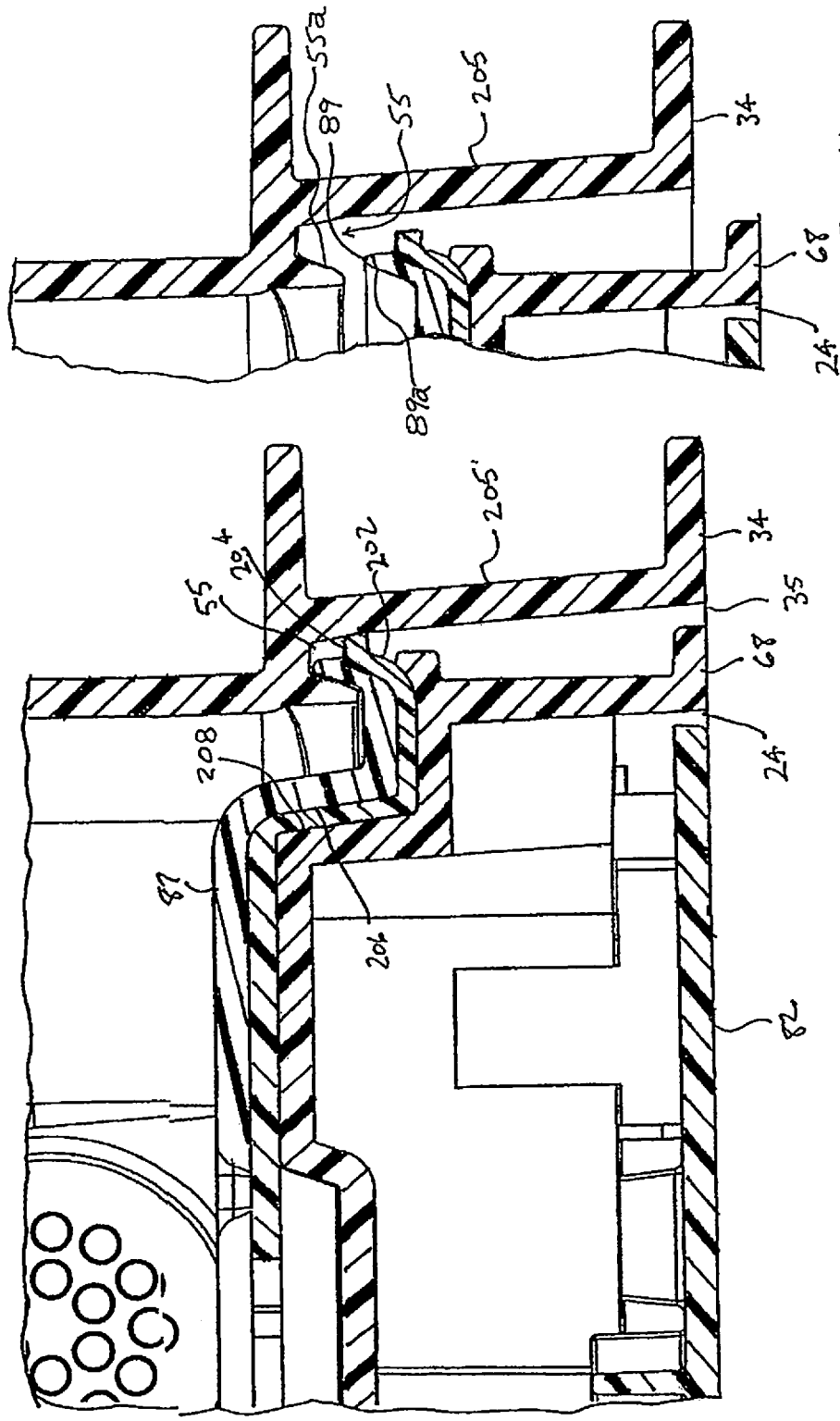
FIG. 4 is a fragmentary cross-sectional view of the container of FIG. 1, depicting the front door assembly engaged in the door frame of the enclosure portion.

FIG. 4 depicts, in fragmentary cross-section, front door 24 fully engaged in door frame 34. FIG. 4A shows it partially separated. Forwardly projecting lip 89 of wafer cushion member 87 is received in generally v-shaped interlock groove 55 of door frame 34, with sloped engagement surface 89a of lip 89 abutting sloped engagement surface 55a of interlock groove 55. Gasket member 92, which is sandwiched between wafer cushion member 87 and body portion 68, has projecting portion 202, which includes laterally projecting lip 204. Lip 204 engages and seals with side wall 205 of door frame 34. It will be appreciated that inwardly facing surface 206 of wafer cushion member 87 can be angled at a slightly different angle from outwardly facing surface 208 of body portion 68 to compress gasket member 92 and provide a clamping force in order to better secure gasket member 92 in place and prevent any slippage or dislocation of gasket member 92.

It will be appreciated that that the abutting engagement of sloped surface 55a and sloped surface 89a forms an interlock between front door 24 and container portion 22, tending to resist outward deflection of top wall 26, bottom wall 27, side walls 28, 30, door frame 34, and front door 24. For example, when container 20 is loaded with wafers and lifted with robotic lifting flange 64, the weight of the wafers will apply a force tending to deflect top wall 26 and bottom wall 27 away from each other, especially at front opening 36. With front door 24 engaged in door frame 34 as depicted in FIG. 4, the engagement of forwardly projecting lip 89 of wafer cushion member 87 in interlock groove 55 enables door 24 to be loaded in tension, thereby resisting deflection of top wall 26 and bottom wall 27.

Figure 8:
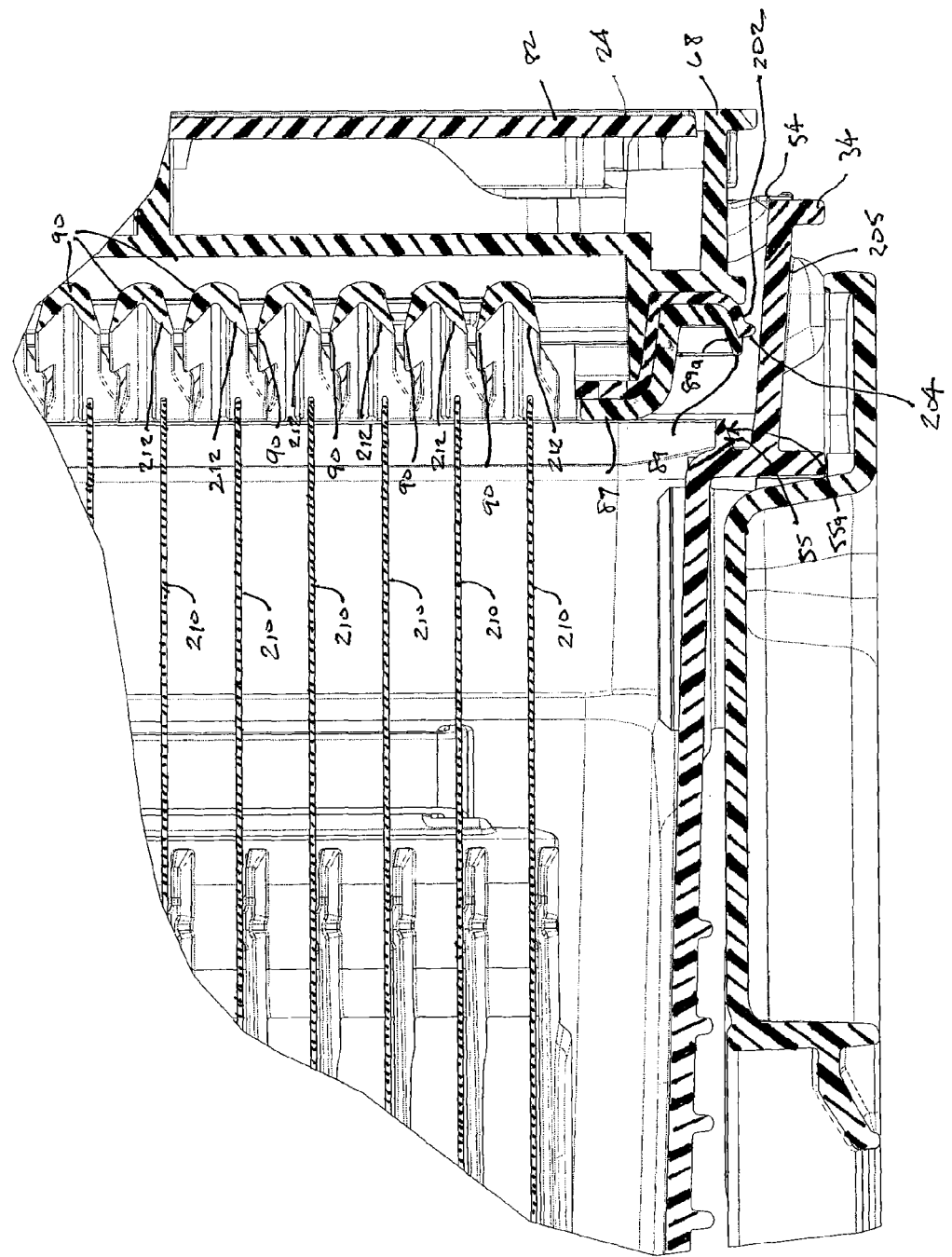
FIG. 8 is a cross-sectional view taken through a corner of a container portion and front door assembly with the front door assembly in a first stage of insertion in the door frame.
Figure 9:
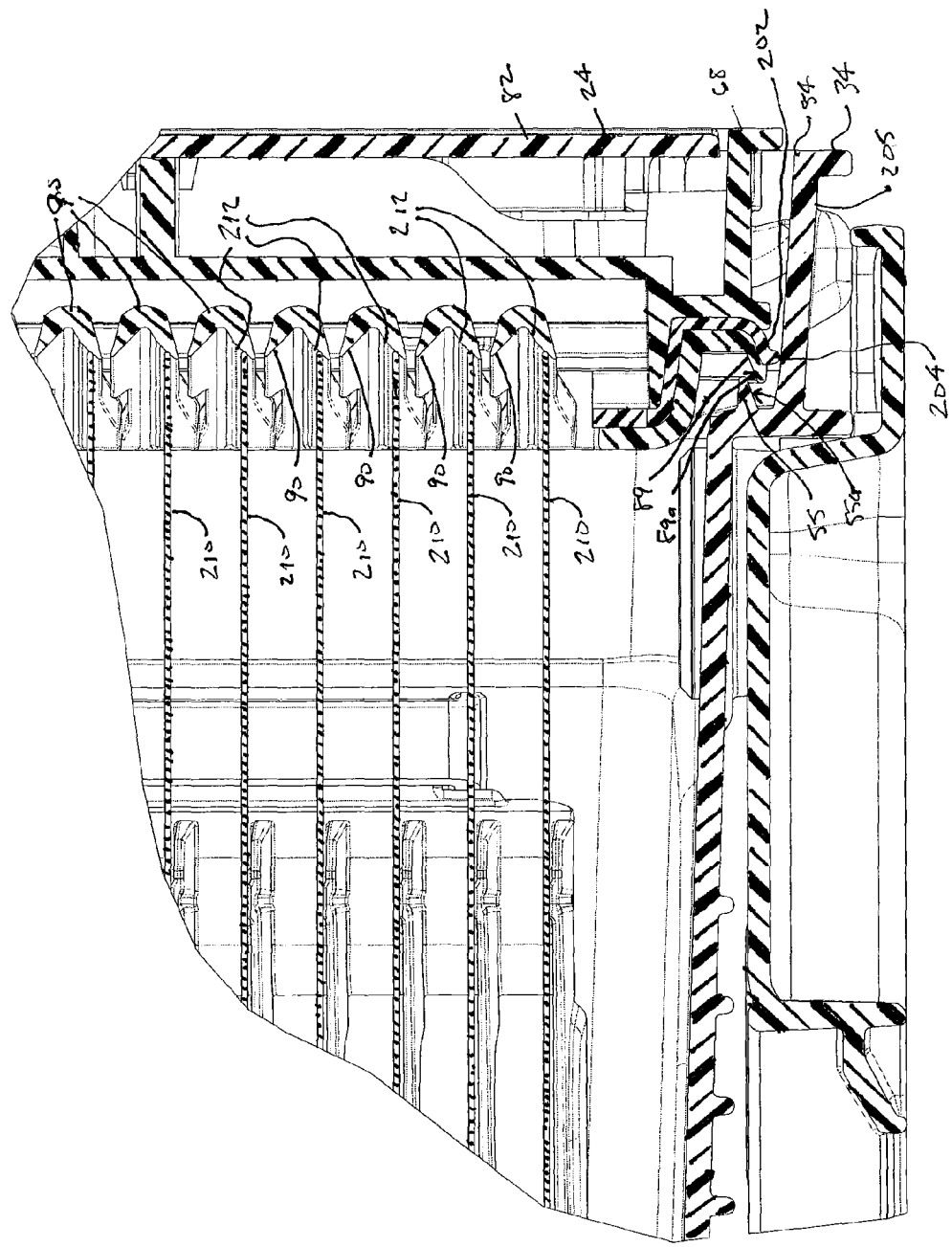
FIG. 9 a cross-sectional view of the corner of the container portion and front door assembly depicted in FIG. 8, with the front door assembly in a second stage of insertion in the door frame.
Figure 10:
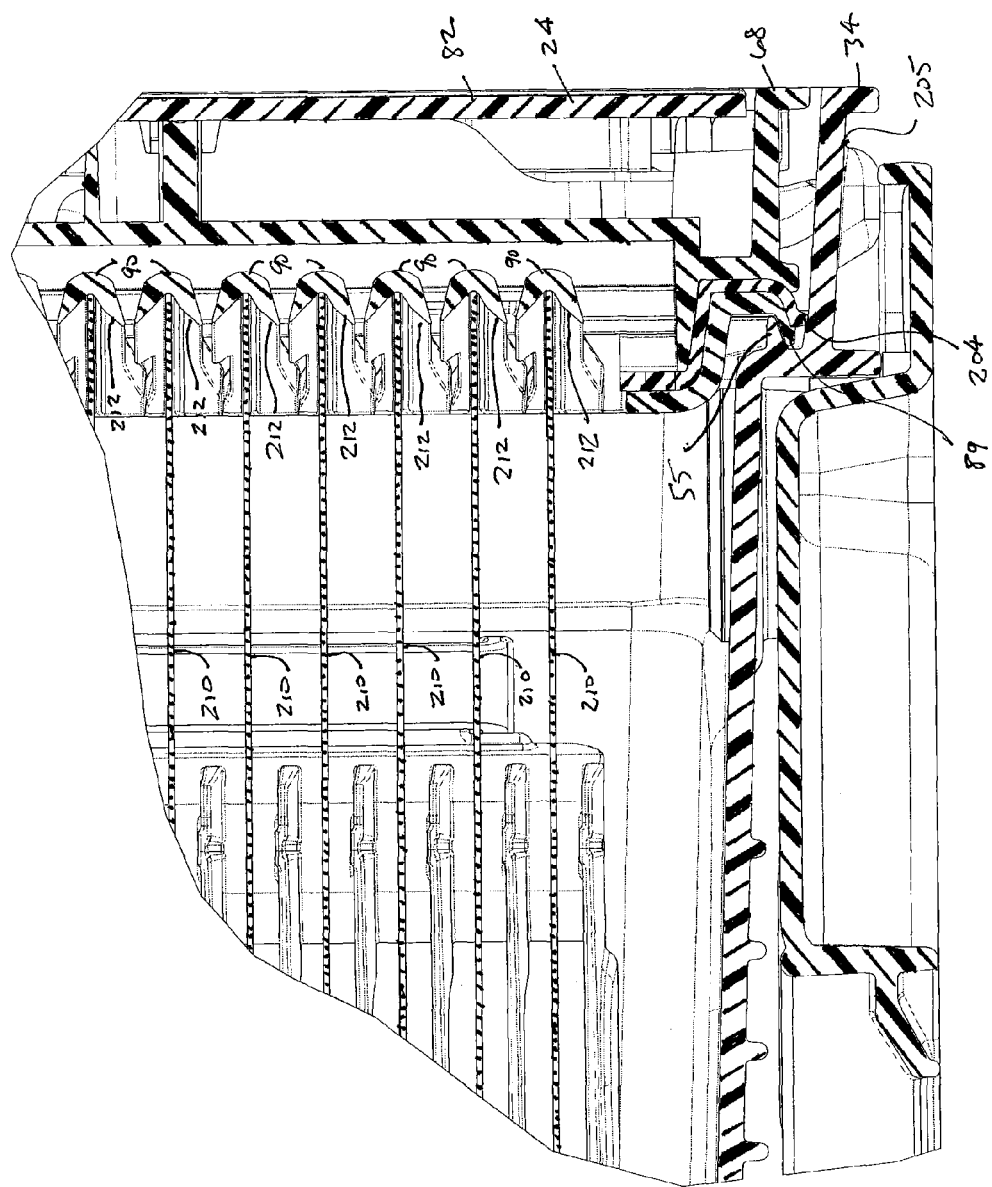
FIG. 10 a cross-sectional view of the corner of the container portion and front door assembly depicted in FIG. 8, with the front door assembly fully seated in the door frame.

FIGS. 8-10 depict front door 24 in successive stages of engagement in door frame 34. In FIG. 8, front door 24 is registered with door frame 34 with projecting portion 202 of gasket member 92 inside outer edge 54 of door frame 34. As front door 24 is advanced into door frame 34 as depicted in FIG. 9, the leading edges of wafers 210 engage lower sloped surfaces 212 of wafer engaging portions 90, causing wafers to ride upward. Projecting portion 202 begins to engage with side wall 205 of door frame 34. In FIG. 10, as front door 24 is advanced into full engagement in door frame 34, the edges of wafers 210 seat in the v-shaped wafer engaging portions 90. Forwardly projecting lip 89 of wafer cushion member 87 is received in interlock groove 55, with sloped surface 89a of lip 89 abutting sloped surface 55a of interlock groove 55. Lip 204 engages and seals against side wall 205 of door frame 34, thereby sealing the interior of enclosure portion 22 and wafers 210 from outside contaminants.

Figure 5:
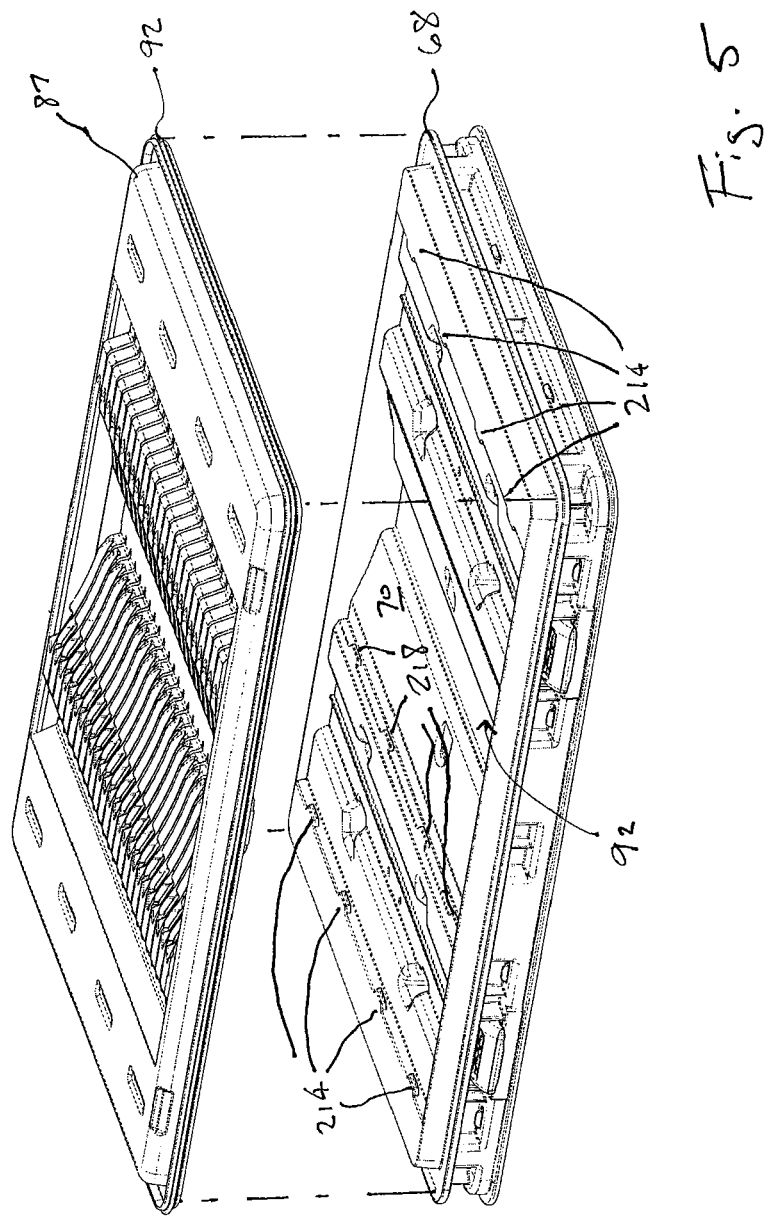
FIG. 5 is an exploded view of a front door assembly, depicting the wafer cushion assembly registered for placement on the door body.
Figure 6:
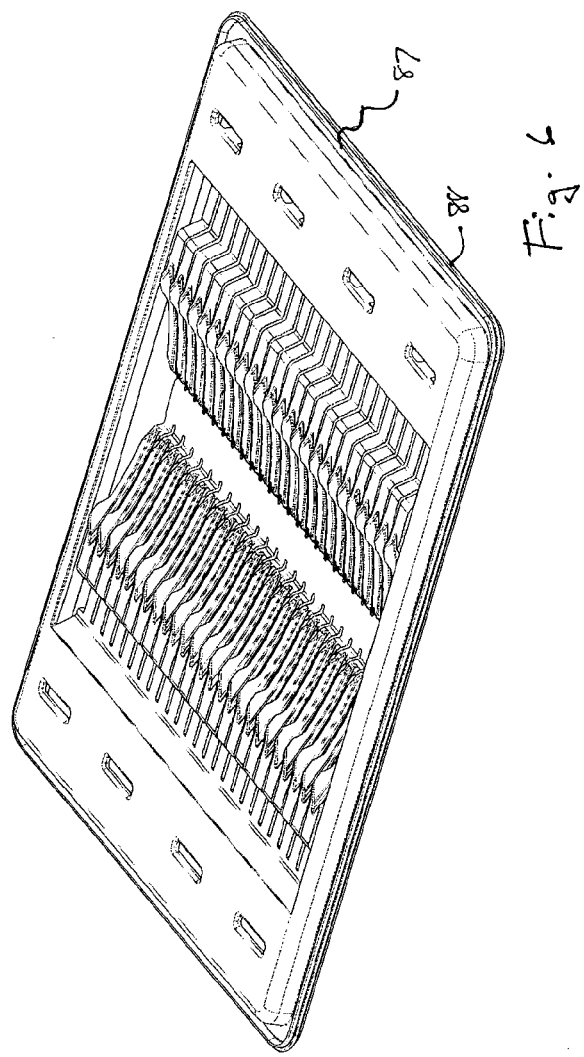
FIG. 6 is an isometric view of a front door cushion assembly with the cushion material extending across substantially the entirety of the inside facing surface of the door.
Figure 7:
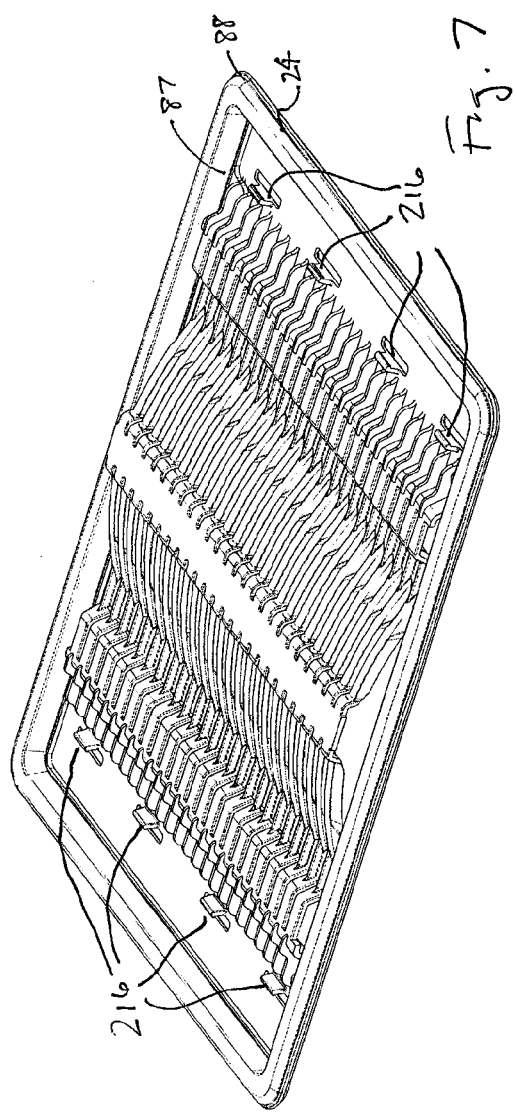
FIG. 7 is an isometric view of the rear side of the front door cushion assembly of FIG. 6.

As depicted in FIGS. 5-7, wafer cushion member 87 can be secured to rear side 70 of body portion 68 with a plurality of engagement structures 214 disposed on rear side 70 proximate each of side peripheral faces 76, 78, that engage corresponding hooks 216 on wafer cushion member 87. If desired, additional engagement structures 218 can be provided nearer the lateral midpoint of rear side 70, engagable with correspondingly disposed hooks on wafer cushion member 87, to further secure wafer cushion member 87 in place.

Figure 11:
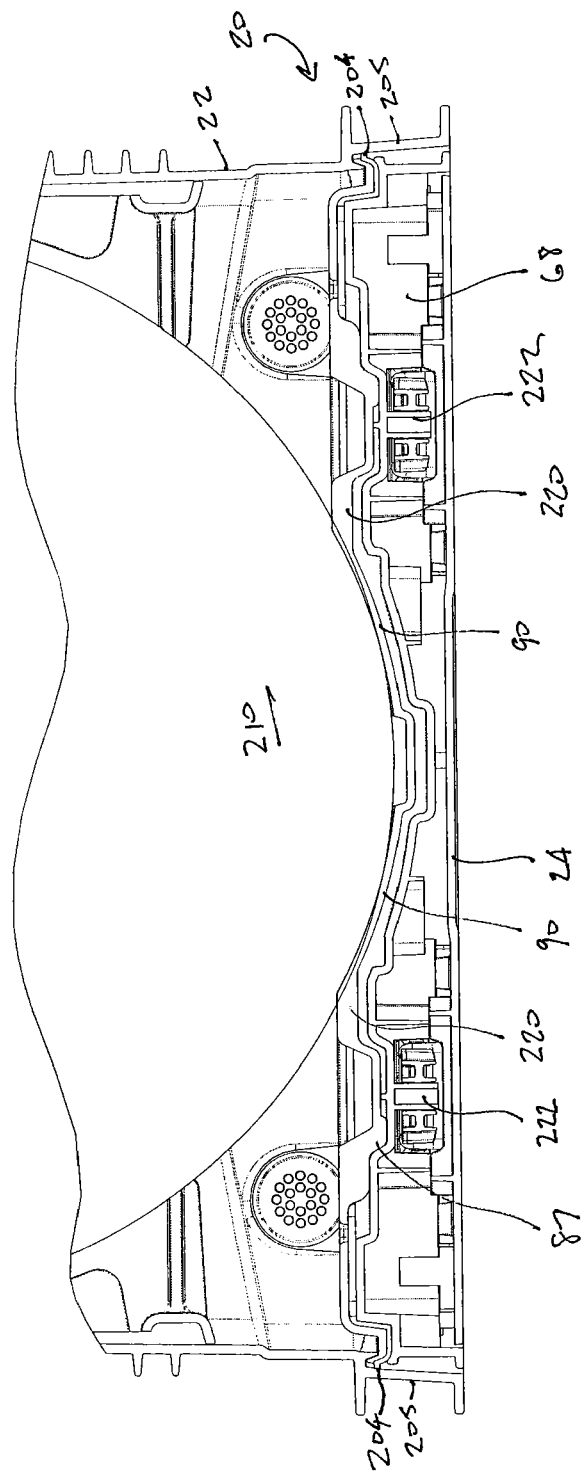
FIG. 11 is a fragmentary cross-sectional view taken at section 11-11 of FIG. 1.

Another advantageous aspect of wafer cushion member 87 in certain embodiments of the invention is depicted in FIGS. 2 and 11. Each wafer engaging portion 90 of wafer cushion 88 is resilient and serves as a spring, when the wafers are fully engaged, to apply limited force to each wafer so as to hold the wafers in place and cushion the wafers against physical shock. According to the depicted embodiment, each wafer engaging portion 90 has a ramped protrusion 220 proximate the outboard edge. This ramped protrusion 220 is disposed proximate the latch mechanisms 222 of front door 24 when wafer cushion member 87 is disposed on body portion 68. The top side of ramped protrusion 220 is the first point of contact for wafers 210 as front door 24 is advanced into door frame 34. As more force is applied by each wafer 210 to wafer engaging portion 90, the wafer engaging portions 90 deflect. Since initial contact occurs at ramped protrusions 220, more of the cushion loading due to the force applied by the spring action of wafer engaging portions 90 is applied to body portion 68 along latching mechanisms 222, where front door 24 is more able to resist outward deflection due to the engagement of latch bolts 86 in latch bolt recesses 56. Consequently, distortion of container 20 from the cushion loading is relatively minimized. It will be appreciated that, in other embodiments, the first point of initial contact of wafers 210 with the bottom edge of ramped protrusion 220 to achieve the same effect.

Another advantageous aspect of certain embodiments is provided by the raised portions 58 around each of the latch bolt recesses 56. These raised portions 58, coupled with the slight outward slope of side wall 205 of door frame 34, enable front door 24 to be spaced apart from door frame 34, especially at outer edge 35. In use, when front door 24 is removed and replaced in door frame 34, there may be movement of air inwardly into enclosure portion 22 due to the hermitic seal. The larger clearance provided by spacing front door 24 further away from door frame 34 may cause the velocity of the air to be reduced from what it would otherwise be, thereby reducing the likelihood that particulates will be entrained in the air and carried into enclosure portion 22 to contaminate the wafers inside. Further, the raised portions 58 can minimize the clearance between front door 24 and door frame 34 at the latch locations, thereby minimizing the unsupported length of latch bolts 86 when they are engaged in latch bolt recesses 56, and reducing possible distortion of front door 24 in the "z" direction.

Figure 12:
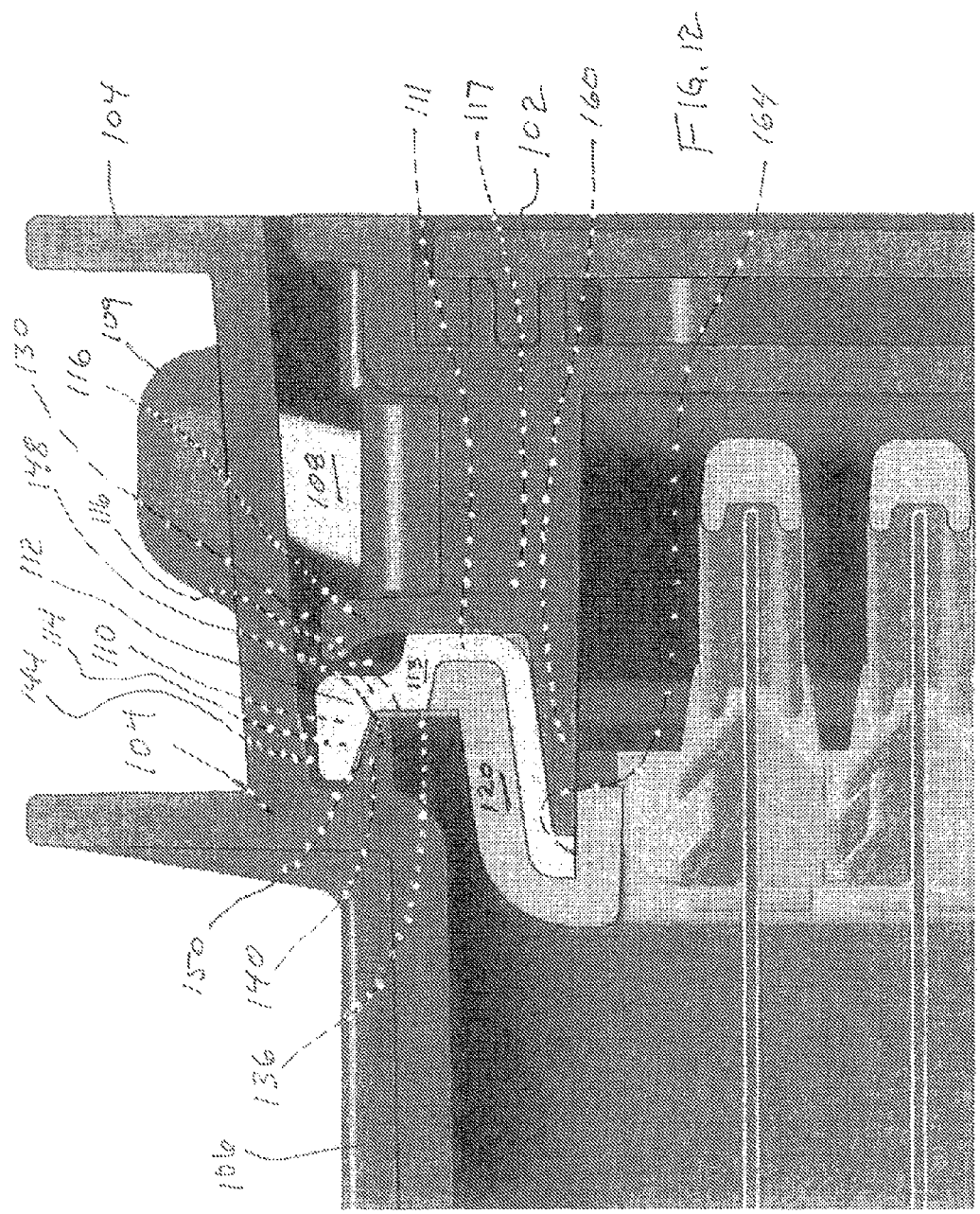
FIG. 12 is a fragmentary cross-sectional view of a door engaged with a door frame of a container portion according to an alternative embodiment of the invention.

Referring to FIG. 12, an alternative embodiment is depicted that has front door 102 engaged in door frame 104 of container portion 106. Latch members 108 extend and retract into receivers 109 on door frame 104 to removably secure the door in the door frame. Sealing member 110 or gasket has elastomeric body 113 with retained portion 111 that is retained by being sandwiched between frame or base portion 117 of the door and inner retention frame 120. Elastomeric body 113 also has non-retained and outwardly extending portion 112. Outwardly extending portion 112 has radially extending portion 116 and axially extending portion 114. Positioned on the container portion side of the seal is strip portion 130 formed of a different material, preferably a polymeric material, that may be non-elastomeric and extends, in a radial perspective, outwardly from the inner retention frame, where it may be adhered thereto, onto the inwardly facing (toward the container portion) vertical face 136 of elastomeric gasket 110, and then angles inwardly and is adhered to angled inward face 140 of the elastomeric gasket for insertion in recess 144. The strip portion may form a door frame engagement portion to primarily or exclusively contact the door rather than the elastomeric body portion. The door frame engagement strip portion 130 extends circumferentially around the inside perimeter of the door frame and engages with the outwardly extending angled protrusion 148 of door frame 104. As depicted, the strip portion may conform to the shape of the door frame where it engages. The elastomeric body and the door frame engagement strip portion define sealing portion 150. The door frame engagement strip portion may be formed from a rigid and resilient strip of polymer material and preferably extends endlessly around the door and is adhered to the elastomeric gasket material such as by over-molding. The engagement strip portion can form the entirety of the engagement of the sealing portion with the door or a portion of the elastomeric gasket can also directly contact and seal with the door. The engagement strip portion can thus provide a sealing engagement that adheres less to the door frame providing for easier removal of the door as compared to the elastomeric gasket material.

FIG. 12 also illustrates a further embodiment of the securement of the gasket 111 between the inner retention frame 120 and base portion 117 of the door. The frame 120 clamps on to an inwardly extending (towards the container portion) protrusion 160 of the door base portion 117 with sealing member 110 also sandwiched between the frame and protrusion at recess 164 in frame 120, and also being compressed therein. Although only a cross section is illustrated at the top of the door, the interfacing components and features, such as the sealing member, strip portion, protrusion, recess, preferably extend the around the entirety of the outer periphery of the door and inner periphery of the door frame.

It will be appreciated that any or all of the components of wafer container 20 may generally be injection molded from polymers typically used for semiconductor wafers. Such materials include, but are not limited to, polycarbonates, fluoropolymers, and polyetheretherketone.

A wafer container 300 according to another embodiment of the present invention is depicted in FIGS. 13-23, and generally includes enclosure portion 302 and door 304. Enclosure portion 322, as depicted in FIGS. 13 and 14 generally includes bottom wall 306, top wall 308, side walls 310, 312, back wall 314, and door frame 316 on the front side of the enclosure defining an opening 318 for receiving door 304. Ramped portions 320 are defined on the inner periphery of door frame 316 proximate the mid-point of each side 322, 324, 326, 328, of the door frame 316, each sloping toward the outer edge 330 in the "z" axis direction as annotated in FIG. 13. Adjacent and inwardly from each ramped portion 320, an elongate projection 332 extends outwardly in the "z" axis direction, defining a generally v-shaped recess 334 extending parallel to outer edge 330 of door frame 316. In addition, latch bolt recesses 336 are defined in each of bottom side 322 and top side 328 of door frame 316. Each latch bolt recess 336 is surrounded by a raised portion 338. A wafer support structure (not depicted) may be provided inside enclosure portion 302 for receiving wafers (not depicted) in a plurality of slots defined in the structure. A robotic lifting flange 340 and a kinematic coupling 342 are known in the art may be provided on the top and bottom outer surfaces respectively of enclosure 302.

Door 304 as depicted in FIGS. 13-23 generally includes body portion 344 presenting rear side 346, front side 348, top peripheral face 350, side peripheral faces 352, 354, and bottom peripheral face 356. A pair of latch recesses (not depicted) are defined in front side 348, and are covered by front panel 358. Each latch recess receives a latching mechanism (not depicted), operable by a key insertable though key apertures 360 in front panel 358 to selectively extend and retract latch bolts 361. Wafer cushion 500 is disposed on rear side 346.

According to an embodiment of the invention, each of top peripheral face 350, side peripheral faces 352, 354, and bottom peripheral face 356 defines a door guide recess 362. The recesses 362 in top peripheral face 350 and bottom peripheral face 356 are centered on vertical door centerline 364, while recesses 362 in the side peripheral faces 352, 354, are centered on horizontal door centerline 366.

Each door guide recess 362 is defined by inner wall 368, side walls 370, 372, and bottom wall 374 as depicted in FIG. 20. Groove 376 is defined in each of side walls 370, 372, and bottom wall 374, and extends around the periphery of the recess 362. Bottom wall 374 also defines guide engagement apertures 378, 380, and central guide engagement aperture 379. A pair of guide tabs 382 extend outwardly from inner wall 368 proximate each end of the recess 362.

Body portion 344 may also define corner door guide receiving recesses 384 at each of the corners 386, 388, 390, 392, of door 304. Each recess 384 can receive a corner door guide (not depicted) as is known in the art to assist in locating door 304 in door frame 316.

Door guide 394 is depicted in Figures and generally includes a unitary elongate body portion 396 formed from polymer material having a low coefficient of friction and favorable low particle generating characteristics, such as mixture of PBT or Acetal. Tabs 398 extend laterally outward from each end 400, 402. Ribs 404 are provided on bottom edge 406, and the central rib 404 includes central locating tab 408. Engagement tabs 410 extend downwardly proximate each end 400, 402, and include detent 412. Inner side 414 also has a wedge shaped projection 416 defined proximate each end 400, 402, each projection 416 defining groove 418. Top edge 420 is defined in a generally U-shaped opening between legs 422, 424. The sides 426 of the U-shaped opening may be slightly inclined as depicted.

One of door guides 394 is removably received in each of door guide recesses 362 in top peripheral face 350, side peripheral faces 352, 354, and bottom peripheral face 356, of body portion 344. Door guide 394 is inserted by registering each of grooves 418 with one of guide tabs 382 and advancing the door guide downwardly as depicted in FIG. 21. As guide 394 is advanced downward, tabs 398 are received and slide in the groove 376 defined in each of side walls 370, 372. Once guide 394 is fully inserted, ribs 404 are received in groove 376 in bottom wall 374 with central locating tab 408 extending through central guide engagement aperture 379. Engagement tabs 410 are received through guide engagement apertures 378, 380, and detent 412 engages behind bottom wall 374 to secure guide 394 in position. With guide 394 in position, guide surfaces 428 face outwardly.

Door 304 is engaged in door frame 316 of enclosure portion 302 by registering door 304 with the opening defined by door frame 316 as depicted in FIG. 13. As door 304 is advanced into frame 316, guide surfaces 428 of door guides 394, engage and slide on ramped portions 320 on the inner periphery of door frame 316. The slight slope of ramped portions 320 helps guide door 304 into the desired position. Moreover, the inclined edges 426 of the U-shaped opening defining top edge 420 may also assist in locating and centering door 304 in door frame 316 in the "x" and "y" directions. Once door 304 is fully engaged in frame 316, the latch mechanisms can be actuated to move latch bolts 361 into latch bolt recesses 336 to secure door 304 in place.

Figure 19:
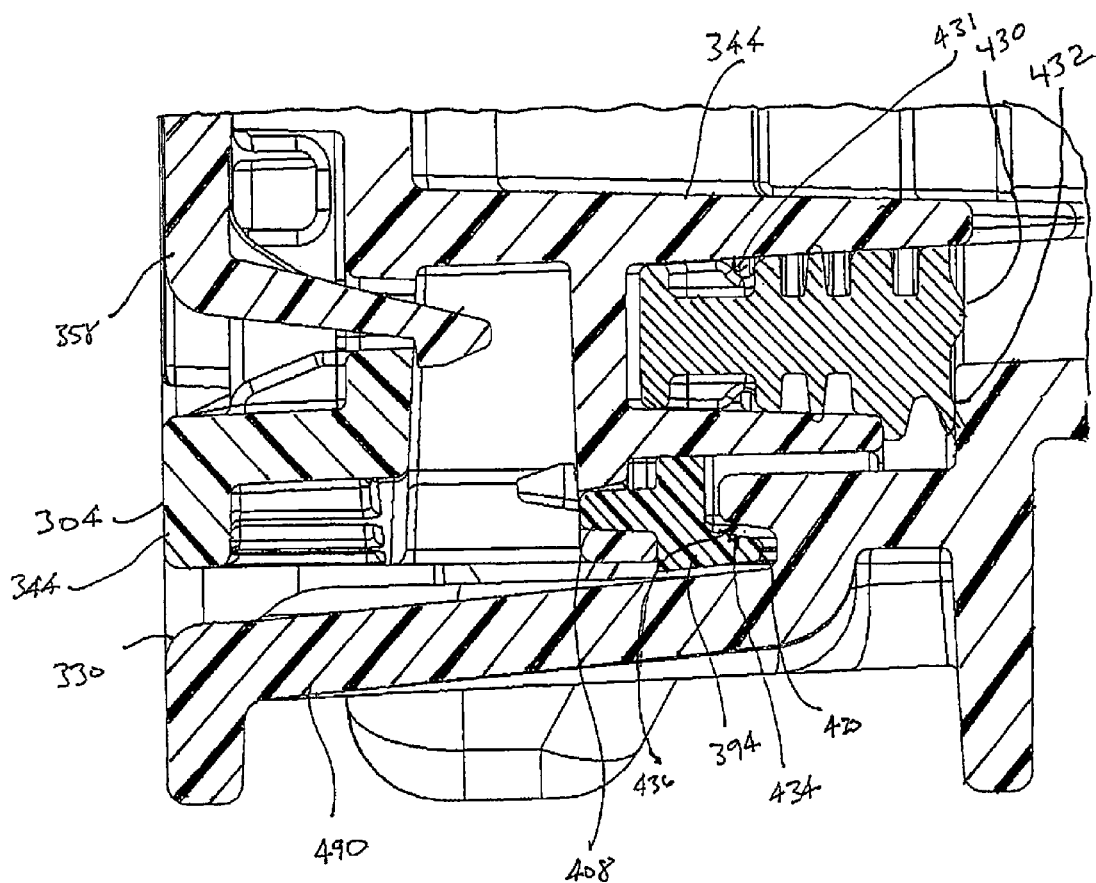
FIG. 19 is a partial cross-sectional view through the bottom door guide taken at section 19-19 of FIG. 14.
Figure 19A:
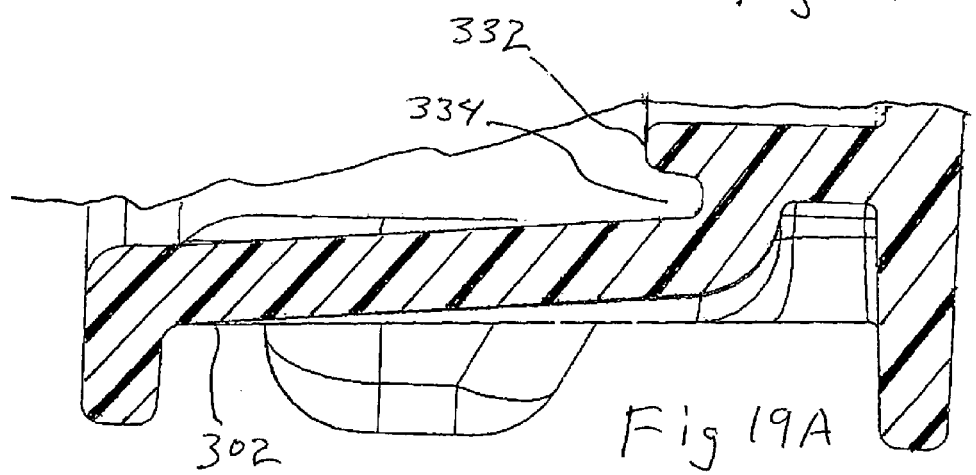
FIG. 19A is a partial cross-sectional view same as FIG. 19 only showing the enclosed portion.

As depicted in the cross-sectional view of FIG. 19, with door 304 in the fully engaged position in frame 316, top edge 420 of guide 394 engages in recess 334. Top edge 420 may be seated in recess 334, that is in contact and engagement, or may be separated and not in direct contact. Elastomeric gasket 430, received in recess 431 on door 304, engages with shoulder 432 on door frame 316 to provide hermetic sealing of the container. The engagement of top edge 420 of guide 394 in recess 334, may serve to "interlock" door 304 in frame 316, to inhibit unintended disengagement of door 304, and damage to the integrity of the hermetic seal occurring due to mechanical shocks to the container. Further, it will be appreciated that the abutting engagement of sloped engagement surface 434 on top edge 420 of door guide 394 with sloped engagement surface 436 in recess 334 may form an interlock between door 304 and container portion 302, tending to resist outward deflection of top wall 308, side walls 310, 312, bottom wall 306, door frame 316, and door 304. For example, when container 300 is loaded with wafers and lifted with robotic lifting flange 340, the weight of the wafers will apply a force tending to deflect top wall 308 and bottom wall 306 away from each other, especially at front opening 318. With door 304 engaged in door frame 316 as depicted in FIG. 19, the engagement of forwardly projecting top edge 420 of door guide 394 in recess 334 enables door 304 to be loaded in tension, thereby resisting deflection of top wall 308 and bottom wall 306.

Still further, it is believed that the central positioning of door guides 394 on top peripheral face 350 and bottom peripheral face 356 on vertical door centerline 364, the central positioning of door guides 394 on the side peripheral faces 352, 354, on horizontal door centerline 366 serve to better locate and position door 304 in the "x", "y" and "z" directions than previously known corner door guides alone. It will be appreciated that the door guides 394 according to embodiments of the present invention may be used alone without corner guides or in conjunction with corner guides if desired to give additional positioning accuracy.

Another advantageous aspect of certain embodiments is provided by the raised portions 338 around each of the latch bolt recesses 336. These raised portions 338, coupled with the slight outward slope of side wall 490 of door frame 316 around its entire periphery, enable door 304 to be spaced apart from door frame 316, especially at outer edge 330. In use, when door 304 is removed and replaced in door frame 316, there may be movement of air inwardly into enclosure portion 302 due to the hermetic seal. The larger clearance provided by spacing door 304 further away from door frame 316 may cause the velocity of the air to be reduced from what it would otherwise be, thereby reducing the likelihood that particulates will be entrained in the air and carried into enclosure portion 302 to contaminate the wafers inside. Further, the raised portions 338 can minimize the clearance between door 304 and door frame 316 at the latch locations, thereby minimizing the unsupported length of latch bolts 361 when they are engaged in latch bolt recesses 336, and reducing possible distortion of door 304 in the "z" direction.

The foregoing descriptions present numerous specific details that provide a thorough understanding of various embodiments of the invention. It will be apparent to one skilled in the art that various embodiments, having been disclosed herein, may be practiced without some or all of these specific details. In other instances, components as are known to those of ordinary skill in the art have not been described in detail herein in order to avoid unnecessarily obscuring the present invention. It is to be understood that even though numerous characteristics and advantages of various embodiments are set forth in the foregoing description, together with details of the structure and function of various embodiments, this disclosure is illustrative only. Other embodiments may be constructed that nevertheless employ the principles and spirit of the present invention. Accordingly, this application is intended to cover any adaptations or variations of the invention.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A front opening container for semiconductor wafers comprising:
    an enclosure portion including a top wall, a bottom wall, a pair of enclosure portion side walls, a back wall, and a door frame opposite the back wall, the door frame defining a front opening, the door frame having a plurality of intersecting door frame side walls forming a plurality of door frame corners, each door frame side wall defining a ramped portion intermediate adjacent door frame corners;
    a door removably received in the door frame for closing the front opening, the door comprising a body portion presenting a plurality of intersecting peripheral faces;
    a plurality of door guides, each door guide centered on a separate one of the peripheral faces such that each door guide is engaged with a separate one of the ramped portions of the door frame when the door is received in the door frame; and
    wherein each door frame side wall further defines a door frame recess, wherein each door frame recess is generally v-shaped and presents an engagement surface, and wherein an edge of each door guide has an engagement surface conformingly disposed so as to confront the engagement surface of the door frame recess when the edge of the door guide is received in the door frame recess.

2. The container of claim 1, wherein each door frame recess comprises an outwardly facing recess and is positioned inward from each ramped portion and extends parallel with a front edge of the door frame, and wherein each door guide defines an edge, the edge of the door guide being engaged in the recess to interlock the door with the enclosure portion when the door is received in the door frame.

3. The container of claim 1, wherein the door includes an elastomeric seal extending around a periphery of the door, the elastomeric seal engaging structure on the door frame when the door is received in the door frame to hermetically seal the enclosure portion.

4. The container of claim 1, further comprising a wafer cushion disposed on a rear side of the door.

5. The container of claim 1, wherein the door guide is made from a low particle generating material.

6. The container of claim 5, wherein the low particle generating material includes acetal or PBT.

7. A front opening container for semiconductor wafers comprising:
    an enclosure portion including a top wall, a bottom wall, a pair of enclosure portion side walls, a back wall, and a door frame opposite the back wall, the door frame defining a front opening, the door frame having a plurality of intersecting door frame side walls forming a plurality of door frame corners, each door frame side wall defining a door frame recess;
    a door removably received in the door frame for closing the front opening, the door comprising a body portion presenting a plurality of intersecting peripheral faces;
    wherein each of the plurality of peripheral faces of the body portion defines a door guide recess, each door guide recess centered on a separate one of the peripheral faces and wherein a separate one of a plurality of door guides is received in each of the door guide recesses and secured by snap-in detents such that each door guide is engaged with the door guide recess on a separate one of the door frame side walls when the door is received in the door frame;
    wherein each door frame recess is generally v-shaped and presents an engagement surface, and wherein an edge of each door guide has an engagement surface conformingly disposed so as to confront the engagement surface of the door frame recess when the edge of the door guide is received in the door frame recess.

8. A front opening container for semiconductor wafers comprising:
    an enclosure portion including a top wall, a bottom wall, a pair of side walls, a back wall, and a rectangular door frame opposite the back wall, the door frame defining a front opening, the door frame defined by side walls extending between corners of the rectangular door frame, each side wall defining a ramped portion intermediate adjacent corners;
    a rectangular door removably received in the door frame for closing the front opening, the door comprising a body portion presenting four intersecting peripheral faces;
    a plurality of door guides, each door guide disposed on a separate one of the peripheral faces such that each door guide is engaged with a separate one of the ramped portions of the door frame when the door is received in the door frame;
    wherein the door frame defines an outwardly facing recess inward from each ramped portion and extending parallel with a front edge of the door frame at the front opening, and wherein the each door guide defines an engagement structure, the engagement structure of the door guide being engaged in the recess to interlock the door with the enclosure portion when the door is received in the door frame; and
    wherein the recess is generally v-shaped and presents an engagement surface, and wherein the engagement structure of the door guide has an engagement surface conformingly disposed so as to confront the engagement surface of the recess when the engagement structure of the door guide is received in the recess.

9. A front opening container for semiconductor wafers comprising:
    an enclosure portion including a top wall, a bottom wall, a pair of side walls, a back wall, and a rectangular door frame opposite the back wall, the door frame defining a front opening, the door frame defined by side walls extending between corners of the rectangular door frame, each side wall defining a ramped portion intermediate adjacent corners;
    a rectangular door removably received in the door frame for closing the front opening, the door comprising a body portion presenting four intersecting peripheral faces; and
    a plurality of door guides, each door guide disposed on a separate one of the peripheral faces such that each door guide is engaged with a separate one of the ramped portions of the door frame when the door is received in the door frame;
    wherein each of the plurality of peripheral faces of the body portion defines a door guide recess, and wherein a separate one of the door guides is received in each of the door guide recesses.

10. The container of claim 9, wherein each of the door guides has at least one engagement structure, the at least one engagement structure received by a corresponding engagement structure in the door guide recess.

11. The container of claim 10, wherein the at least one engagement structure is an engagement tab, and the corresponding engagement structure is an aperture.

* * * * *